US009239359B2

(12) United States Patent
Marinissen et al.

(10) Patent No.: US 9,239,359 B2
(45) Date of Patent: Jan. 19, 2016

(54) TEST ACCESS ARCHITECTURE FOR TSV-BASED 3D STACKED ICS

(71) Applicants: IMEC, Leuven (BE); Stichting IMEC Nederland, Eindhoven (NL)

(72) Inventors: Erik Jan Marinissen, Leuven (BE); Jacobus Verbree, Hierden (NL); Mario Konijnenburg, Best (NL); Chun-Chuan Chi, Pingtung Country (TW)

(73) Assignees: IMEC, Leuven (BE); Stichting IMEC Nederland, Eindhoven (NL)

( * ) Notice: Subject to any disclaimer, the term of this patent is extended or adjusted under 35 U.S.C. 154(b) by 544 days.

(21) Appl. No.: 13/626,538

(22) Filed: Sep. 25, 2012

(65) Prior Publication Data

US 2013/0024737 A1   Jan. 24, 2013

Related U.S. Application Data

(63) Continuation of application No. PCT/EP2011/054722, filed on Mar. 28, 2011.

(60) Provisional application No. 61/318,173, filed on Mar. 26, 2010, provisional application No. 61/318,680, filed on Mar. 29, 2010.

(30) Foreign Application Priority Data

Sep. 20, 2010   (EP) .................................... 10177675

(51) Int. Cl.
*G01R 31/3185*   (2006.01)
*G01R 31/3177*   (2006.01)
*G01R 31/317*   (2006.01)

(52) U.S. Cl.
CPC  *G01R 31/318508* (2013.01); *G01R 31/318511* (2013.01); *G01R 31/318513* (2013.01); *G01R 31/3177* (2013.01); *G01R 31/31717* (2013.01); *G01R 31/318572* (2013.01)

(58) Field of Classification Search
CPC ................... G01R 31/3177; G01R 31/318533; G01R 31/318538; G01R 31/318544; G01R 31/318505; G01R 31/318583; G01R 31/318536; G01R 31/318511; G01R 31/31855; G01R 31/318508; G01R 31/318513; G01R 31/318572; G01R 31/31717
USPC ......................................... 714/726, 727, 724
See application file for complete search history.

(56) References Cited

U.S. PATENT DOCUMENTS 6,990,618 B1 *  1/2006  Lulla et al. ..................... 714/727
7,315,969 B2 *  1/2008  Jakobs .......................... 714/718

(Continued)

OTHER PUBLICATIONS

International Search Report for International Application No. PCT/EP2011/054722 dated May 11, 2011 by European Patent Office.

(Continued)

*Primary Examiner* — James C Kerveros
(74) *Attorney, Agent, or Firm* — Knobbe, Martens, Olson & Bear LLP

(57) ABSTRACT

A test access architecture is disclosed for 3D-SICs that allows for both pre-bond die testing and post-bond stack testing. The test access architecture is based on a modular test approach, in which the various dies, their embedded IP cores, the inter-die TSV-based interconnects, and the external I/Os can be tested as separate units to allow optimization of the 3D-SIC test flow. The architecture builds on and reuses existing design for test (DfT) hardware at the core, die, and product level. Test access is provided to an individual die stack via a test structure called a wrapper unit.

20 Claims, 26 Drawing Sheets

(56) References Cited

U.S. PATENT DOCUMENTS

| | | | |
|---|---|---|---|
| 7,401,277 B2* | 7/2008 | Yamada et al. | 714/726 |
| 7,451,367 B2* | 11/2008 | Pedersen | 714/718 |
| 7,673,203 B2* | 3/2010 | Park et al. | 714/726 |
| 7,725,784 B2* | 5/2010 | Laouamri et al. | 714/724 |
| 7,757,139 B2* | 7/2010 | Hua | 714/727 |
| 7,818,640 B1* | 10/2010 | Lerner | 714/726 |
| 7,979,764 B2* | 7/2011 | Foutz et al. | 714/729 |
| 8,384,411 B2* | 2/2013 | Mooyman-Beck et al. | 324/762.02 |
| 8,645,777 B2* | 2/2014 | Zimmerman | 714/724 |
| 8,914,692 B2* | 12/2014 | Goel | 714/727 |
| 8,977,919 B2* | 3/2015 | Whetsel | 714/729 |
| 2013/0185608 A1* | 7/2013 | Bhawmik | G01R 31/318508 714/727 |

OTHER PUBLICATIONS

Extended European search report for European Patent Application No. 10177675.5 dated Dec. 3, 2010 by European Patent Office.

Noia et al., "Test-wrapper optimization for embedded cores in TSV-based three-dimensional SOCs", Computer Design, 2009. ICCD 2009. IEEE International Conference on, IEEE, Piscataway, NJ, USA, Oct. 4, 2009, pp. 70-77.

Erik Jan Marinissen et al., "Testing 3D chips containing through-siilicon cias", Test Conference, 2009. ITC 2009. International, IEEE, Piscataway, NJ, USA, Nov. 1, 2009, pp. 1-11.

Wu et al., "Scan chain design for three-dimensional integrated circuits (3D ICs)". Computer Design, 2007. ICCD 2007. 25$^{th}$ International Conference on, IEEE, Piscataway, NJ, USA, Oct. 7, 2007, pp. 208-214.

Lewis et al., "A scan-island based design enabling pre-bond testability in die-stacked microprocessors", Proceedings International Test Conference 2007, Santa Clara, CA, USA Oct. 23, 2007-Oct. 25, 2007, pp. 1-8.

Jiang et al., "Test Architecture Design and Optimization for Three-Dimensional SoCs", Proc. Design, Automation, and Test in Europe (Date), Apr. 2009, pp. 220-225.

Jiang et al., "Layout-Driven Test-Architecture Design and Optimization for 3D SoCs under Pre-Bond Test-Pin-Count Constraint", Proc. International Conference on Computer-Aided Design (ICCAD), Nov. 2009, pp. 191-196.

Wu et al., "Test-Access Mechanism Optimization for Core-Based Three-Dimensional SOCs", Proc. International Conference on Computer Design (ICCD), Oct. 2008, pp. 212-218.

Lo et al., "SOC Test Architecture and Method for 3D-IC", Design, Automation, and Test in Europe (Date)'s 09 Friday Workshop on 3D integration, Nice, Apr. 24, 2009.

* cited by examiner

TEST ACCESS ARCHITECTURE FOR TSV-BASED 3D STACKED ICS

CROSS REFERENCE TO RELATED APPLICATIONS

This application is a continuation of PCT Application No. PCT/EP2011/054722, filed Mar. 28, 2011, which claims priority under 35 U.S.C. §119(e) to U.S. provisional patent applications 61/318,173 filed on Mar. 26, 2010 and 61/318,680 filed on Mar. 29, 2010. Each of the above applications is incorporated herein by reference in its entirety.

BACKGROUND OF THE INVENTION

1. Field of the Invention

The disclosed technology relates in general to integrated circuit (IC) design and testing, and in particular to a test architecture for 3D stacked ICs (SIC) interconnected by through-substrate vias (TSVs) and a method thereto.

2. Description of the Related Technology

The semiconductor industry is preparing itself for 3D-SICs based on TSVs. TSVs are conducting nails which extend out of the back-side of a thinned-down die and enable the vertical interconnect to another die. TSVs are high-density, low-capacity interconnects compared to traditional wire-bonds, and hence allow for many more interconnections between stacked dies, while operating at higher speeds and consuming less power. TSV-based 3D technologies enable the creation of a new generation of 'super chips' by opening up new architectural opportunities. Combined with their smaller form factor and lower overall manufacturing cost, 3D-SICs have many compelling benefits, and hence their technology is quickly gaining ground. Like all micro-electronics, TSV-based die stacks have a manufacturing process that is sensitive to defects, and hence 3D-SICs need to undergo electrical testing to ensure product quality. While the process and design technology is getting to maturity, testing 3D-SICs for manufacturing defects is considered by many as a major, still largely unresolved obstacle to make these devices a product reality.

Currently, different types of test architectures exist.

A commonly-used test access architecture for PCBs is based on IEEE Std. 1149.1, Boundary Scan (a.k.a. 'JTAG'). In order for chips to be compliant to IEEE 1149.1, a small hardware wrapper is added to them. IEEE 1149.1 works through a narrow single-bit interface, as every JTAG terminal requires an additional chip pin and these are considered expensive. Fortunately, the prime focus of IEEE 1149.1 is PCB interconnect testing, and that requires only a small number of test patterns.

The single-bit interface pins are called TDI and TDO, and they are adapted for transporting both instructions and test data. The control interface consists of the pins TCK, TMS (and optionally TRSTN). For an example PCB 10 containing three chips, Chip A, Chip B and Chip C, a common JTAG-based test access architecture 11 is depicted in FIG. 1. The control signals TCK (clock), TMS (Mode Select) and optionally TRSTN are broadcast to all chips Chip A, Chip B, Chip C, while the TDI-TDO pins are concatenated through the chips. The broadcast control signals can configure a TAP Controller finite state machine 12 in a mode in which it is willing to receive instructions, which are subsequently scanned into the Instruction Register (IR) 13 via the daisy-chained TDI-TDO interface. It is to be noted that this allows for different instructions for different chips; for example, Chip B can be configured in INTEST mode (internal test of the chip), while Chips A and C are configured in BYPASS mode. Then, the chips are brought into their instructed test modes via the broadcast control signals and test data is scanned in and out again via the daisy-chained TDI-TDO interface. The selected test data register (e.g., the bypass register 14, a boundary scan register (BSR) 15, or a chip-internal scan chain 16) depends on the instruction, and can be different for different chips; in any case, it is a single shift register, as shown in FIG. 1.

A commonly-used test access architecture for (two-dimensional) SOCs containing embedded IP cores is based on IEEE Std. 1500. Like IEEE 1149.1, IEEE 1500 adds a small hardware wrapper around the module-under-test. As shown in FIG. 2, the test access architecture for an IEEE 1500-based SOC shows similarities to IEEE 1149.1-based PCBs. For an example SOC 20 containing three cores, Core A, Core B and Core C, a common IEEE 1500-based test access architecture 21 is depicted in FIG. 2.

Control signals TCK, TMS and optionally TRSTN are broadcast to all cores Core A, Core B, Core C. Once configured in the appropriate mode via the IEEE 1149.1 test structures, instructions are shifted into the wrapper instruction register (WIR) 23 of the cores via the daisychained WSI-WSO interface. That same instruction interface also doubles as single-bit test data interface. However, next to the similarities, there are also significant differences between IEEE 1149.1- and IEEE 1500-based test access architectures. Below, the most important ones are listed.

Unlike IEEE 1149.1, the focus of IEEE 1500 is not (only) on testing wiring interconnects between cores. First of all, the interconnect circuitry in between IP cores typically does not consist only of wires, but is often formed by deep sequential logic. In addition, IEEE 1500 is meant to support also the testing of the cores themselves, and IP cores are often significantly-sized and complex design entities. Therefore, the test data volumes involved are typically quite large, and a single-bit test data interface would not suffice. Hence, IEEE 1500 has an optional n-bit ('parallel') test data interface (named WPI and WPO), where n can be scaled by the user to match the test data volume needs of the IP core in question.

Adding wider interfaces to embedded IP cores does not add chip pins as in IEEE 1149.1, but only core terminals, which are considered to be significantly less expensive than chip pins.

IEEE 1149.1 has two (or three) standardized control pins TCK, TMS, TRSTN, which are expanded within the chip by the TAP Controller 12. IEEE 1500 has no TAP Controller, but receives it control signals directly. These are six (or seven) signals: WRCK, WRSTN, SELECTWIR, SHIFTWR, CAPTUREWR, UPDATEWR (and optionally TRANSFERDR).

FIG. 2 also features a parallel wrapper bypass 24. This bypass 24 is not mandated by IEEE 1500, but often implemented to shorten the test access path to other cores in the same test access mechanism (TAM). It is the task of the switch boxes 25, 26 in FIG. 2 to make an effective mapping between the active WIR instruction mode and the TAM-to-chain connections.

IEEE 1500 only standardizes the core-level test wrapper, and not the SOC-level test access architecture of the optional parallel TAMs. At the SOC-level, optimizations can be made w.r.t. TAM type, TAM architecture, and corresponding test schedule. In a typical implementation, as shown in FIG. 2, the SOC 20 itself may be equipped with an IEEE 1149.1 wrapper to facilitate board-level testing. The IEEE 1500 serial interface (WSC, WSI, and WSO) may be multiplexed onto the IEEE 1149.1 Test Access Port to save otherwise additional test pins. The IEEE 1500 parallel interface (WPI and WPO) can be multiplexed onto the functional external pins, as is common for regular scan chains; this also saves otherwise additional test pins.

"Dean L. Lewis and Hsien-Hsin S. Lee, 'A Scan-Island Based Design Enabling Prebond Testability in Die-Stacked Microprocessors' Proc. IEEE International Test Conference (ITC), October 2007" is dedicated to testability of 3D-SICs. It focuses on pre-bond die testing, required to achieve acceptable compound stack yields. Testing incomplete products as formed by the various stack tiers is identified as a potential problem. In the paper a 'scan island' approach is proposed, which is essentially the wrapper technology from IEEE 1149.1 and IEEE 1500.

Most other work on 3D-SIC testing implicitly proposes a test access architecture, while focusing on optimizing the design parameters of that architecture to minimize the resulting test length and/or the associated wire length. "Xiaoxia Wu, Paul Falkenstern, and Yuan Xie, 'Scan Chain Design for Three-dimensional Integrated Circuits (3D ICs)', Proc. International Conference on Computer Design (ICCD), p. 208-214, October 2007" describe three scan chain optimization approaches for 3D-SICs. Implicitly, this paper assumes that a single logic test unit is partitioned over multiple tiers. In "Xiaoxia Wu et al., Test-Access Mechanism Optimization for Core-Based Three-Dimensional SOCs', Proc. International Conference on Computer Design (ICCD), p. 212-218, October 2008", the authors propose a core-based design and test approach (as common for 2D-SOCs) in which each core resides on a single tier. The paper proposes an ILP-based (integer linear programming) Test Access Mechanism (TAM) optimization approach, which tries to minimize the resulting test length under a constraint for the number of additional 'test TSVs'. Both papers focus exclusively on post-bond stack testing, and ignore the requirements for pre-bond die testing.

Jiang et al. describe in "Li Jiang, Lin Huang, and Qiang Xu, 'Test Architecture Design and Optimization for Three-Dimensional SoCs', Proc. Design, Automation, and Test in Europe (DATE), pages 220-225, April 2009", a TAM optimization approach based on simulated annealing that minimizes test length and TAM wire length with a user-defined cost weight factor. They assume a modular core-based 3DSIC test approach and take both pre-bond and post-bond test lengths into account. The paper lacks constraints on wafer and packaged stack test access, due to which it unrealistically allows TAMs to start and end at any stack tier. Successor paper, "Li Jiang et al., 'Layout-Driven Test-Architecture Design and Optimization for 3D SoCs under Pre-Bond Test-Pin-Count Constraint', Proc. International Conference on Computer-Aided Design (ICCAD), p. 191-196, November 2009", remedies this partly, by working with pre-bond tests that are applied through dedicated probe pads at the die in question, for which a maximum count is assumed. The paper proposes heuristics that determine a post-bond stack test architecture, from which segments are reused as much as possible to build additional die-level test architectures for the pre-bond tests, while meeting the maximum probe pad count constraint and minimizing test length and TAM wire length. Adding dedicated probe pads is expensive in terms of substrate area, and hence is to be avoided.

Chih-Yen Lo et al. describe in "Chih-Yen Lo, Yu-Tsao Hsing, Li-Ming Denq and Cheng-Wen Wu, 'SOC Test Architecture and Method for 3D-IC', DATE '09 Friday Workshop on 3D integration, Nice, Apr. 24, 2009" that, to consider the yield issues of 3D-IC manufacturing, they perform a known-good-die (KGD) test before die stacking. Every time a new KGD is mounted on the original stacked chip, a through-substrate via test is performed for 3D interconnect verification between the two top-most layers. A test architecture is described which consists of an extended JTAG/IEEE 1149.1 Test Access Port Controller and multiplexer-based test access mechanism (TAM) buses.

There is room for improved test architectures of 3D stacked ICs.

SUMMARY OF CERTAIN INVENTIVE ASPECTS

Certain inventive aspects relate to a good test architecture for 3D stacked ICs and a good method for testing 3D stacked ICs.

In a first aspect, there is a die comprising test circuitry for testing that die and/or for testing, when the die is stacked, interconnections between that die and an adjacent die. Such interconnections can for example be TSVs, but the invention is not limited thereto: it can also be other interconnections obtained by other interconnect technologies, such as for example wire bonding. In one aspect, the test circuitry comprises a first input port for receiving test stimuli and a first output port for sending test responses, the first input port and the first output port being located at a same side of the die ("side" being defined with respect to the present invention as a major surface of a die, i.e. in most cases bottom or top side), there being a data signal path within the die between the first input port and the first output port, and at least one second output port for sending test stimuli towards another die and at least one second input port for receiving test responses from the another die, there being a data signal path within the die between the first input port and at least one of the second output ports, and a data signal path within the die between at least one of the second input ports and the first output port.

A die according to one aspect may further comprise a number of switches for switching between a mode for sending signals over the data signal path within the die between the first input port and the first output port and a mode for sending signals within the die between at least one of the second input ports and the first output port. The number of switches may depend on the number of dies anticipated to be placed on top of the die under reference.

Over a test access path built in accordance with one aspect, stimuli are injected into the die. Subsequently, testing takes place. Hereto, the die is switched from test access mode into test mode. The injected stimuli are then used for testing the die, and test responses are generated. Subsequently, the die again switches from test mode into test access mode, and the generated responses are sent, while at the same time possibly new test stimuli are injected into the die. In terms of modes the die can be in, this means that the die can be in TURN or ELEVATOR mode. In TURN mode, the responses from the die under consideration are sent down; in ELEVATOR mode the responses received from a higher-up die in the stack are sent down. Furthermore, the die can be in INTEST, EXTEST or BYPASS mode. In INTEST and EXTEST mode, stimuli injected into the die are actually used for testing purposes; in BYPASS mode, the stimuli are injected into the die but only for transportation purposes (towards another die).

A die according to one aspect may furthermore comprise an instruction register for loading and storing instructions determining whether test responses will be sent towards the first output port from either the first input port or from one of the at least one second input ports. The instruction register may be such that it does not react to a fixed address, but to the place in the instruction register chain. Hence a die with such instruction register can be placed at any location within the stack, and does not need to be predestined for a fixed location.

A die according to one aspect may furthermore comprise at least one registration element, e.g. a flip-flop, a register, a latch, in the signal path between the first input port and the at least one second output port and at least one registration element, e.g. a flip-flop, a register, a latch, in the signal path between the at least one second input port and the first output port. These registration elements may be used for repairing the slack occurring during propagation of a signal to another die. By providing the registration elements, a die according to one aspect may be adapted for working for an undetermined number of stack tiers.

A die according to one aspect may furthermore comprise at least one further input port and/or at least one further output port connected to the data signal path between the first input port and the first output port and/or to the data signal path between the first input port and at least one of the second output ports, and/or to the data signal path between at least one of the second input ports and the first output port. These further input or output ports are dedicated probe pads adapted for facilitating pre-bond die testing.

A die according to one aspect may furthermore comprise circuitry that automatically detects whether the die is in pre-bond or post-bond configuration. Such circuitry may be adapted for generating a control signal for selecting between the first input port and the at least one further input port, or thus for selecting a correct switch setting in case or post-bond stacking an pre-bond probing.

In a die according to one aspect, the data signal path between the first input port and the first output port comprises a single-bit width, or thus serial, path and a multiple-bit width, or thus parallel, path.

A die according to one aspect may furthermore comprise design-for-test structures for loading and storing test data. The design-for-test structures may comprise a set of data registers e.g. internal scan register, boundary scan register, bypass register, user defined register.

In a die according to one aspect, the at least one second input port and the at least one second output port may be physically located at a side of the die which is opposite with respect to the side of the first input and output ports. Again here, side is intended to mean a major surface of the die.

A die according to one aspect may comprise at least one embedded core, for example, but not limited thereto, an IEEE Std 1500 compliant core, provided with at least one core-level instruction register, a plurality of instruction registers associated with the die being concatenated in a register chain, wherein the register chain is a hierarchical instruction register chain adapted for operation such that a die-level instruction register instruction determines whether core-level instruction registers are bypassed.

One inventive aspect provide die-level structures that, when compliant dies are brought together in a stack, provide a stack-level test architecture that enables transportation of test control and test data signals for the test of (1) intra-die circuitry and (2) inter-die interconnects. According to one aspect, such testing may be performed in pre-stacking and/or post-stacking situations. In accordance with one aspect, testing in post-stacking situation may be performed for partial and/or complete stacks. According to one aspect, testing may be performed in pre-packaging and/or post-packaging situations.

In particular embodiments of the first aspect, a test architecture for testing a plurality of stacked dies interconnected by means of through-substrate vias (TSV) is presented. The test architecture comprises a test access mechanism arranged for performing a sequence of tests. The sequence of tests may comprise tests for testing each die or a number of dies of the plurality of stacked dies, for testing the interconnections between the dies and/or for testing in the complete stack. The tests may be performed before or after bonding. The test architecture further comprises a plurality of test wrapper units, each test wrapper unit associated with one of the dies and comprising dedicated probe pads. The test architecture comprises a plurality of instruction registers arranged for loading and storing sequences of tests. At least one of the plurality of instruction registers is associated with each test wrapper unit. The plurality of instruction registers may be concatenated in a register chain. The wrapper unit resides at the boundary of the die and provides a way to test the die, the interconnections between the dies and the complete stack. It adds a die-level wrapper, with the following features: (1) dedicated probe pads on the non-bottom dies to facilitate pre-bond die testing, (2) TestElevators that transport test control and data signals up and down during post-bond stack testing, and (3) a hierarchical wrapper instruction register (WIR) chain.

The wrapper unit comprises test interface signals, an instruction register, and a set of data registers. The instruction register is a register accessed by the test interface signals to load test instructions that control the operation of the wrapper unit, in particular the instructions control the selection of a data register and control the mode of operation of the selected data register. The selected data register may be accessed by the test interface to shift test data in and out of the wrapper unit. The set of data registers may comprise for example internal scan register for testing the die circuitry, boundary scan register for controlling the inputs and outputs of the die during testing and a bypass for bypassing the wrapper unit. Any other user defined data registers may be included in the set of data registers of the wrapper unit.

The test access architecture according to one aspect provides a trade-off between additional area cost for design-for-test (DfT), test generation effort, and test length. Substrate area, e.g. silicon area, can be minimized by re-using the existing intra-die Dff infrastructure: internal scan chains, test control, test data compression circuitry, built-in self-test, etc.

The test access architecture allows for flexible test scheduling to minimize the test length. The test access architecture itself is testable. This can be done without depending on the correct functionality of the existing Dff inside the local dies and embedded IP cores.

The test access architecture according to particular embodiments comprises dedicated probe pads. Hence pre-bond testing is enabled, even for non bottom dies.

The sequence of test comprises a first set of selected tests. The test access architecture comprises dedicated u-turn type tests. For the post-bond stack tests, test access is only possible via the bottom die. This implies that signals for test control and test data exclusively come from and go to the bottom die.

The sequence of test comprises a second set of selected tests; elevator tests. These set of tests enable all test signals have to be transported up and down through new type of DfT hardware that includes TSVs and which we refer to as TestElevators, in order to reach dies higher up in the stack.

All wrappers, TAMs, and their control signalling paths all needs to be predesigned in the die; not only for that die, but also for the dies above it in the stack. Hence, for all tiers, the DfT is designed in adherence to a pre-defined test access architecture, or can be modified.

In one aspect, the test access architecture is scalable, in the sense that it works for an undetermined number of stack tiers.

In a second aspect, there is a stack comprising at least one die according to the first aspect. Hence, a stack in accordance with one aspect comprises at least one die with a test architecture adapted for performing tests both before and after bonding.

In a stack according to one aspect, a second output port of a first die is connected to a first input port of a second die, and a first output port of the second die is connected to a second input port of the first die.

In a stack according to one aspect, at least one die may comprise external input/output ports. The at least one die comprising external input/output ports may be positioned at an extremity of the stack.

In a stack according to one aspect, a plurality of instruction registers associated with different dies may be concatenated in a register chain. The instruction register may be such that it does not react to a fixed address, but to the place in the instruction register chain. Hence die with such instruction register can be placed at any location within the stack, and is not predestined for a fixed location. At least one of the dies in the stack may comprise at least one embedded core, e.g. an IEEE Std 1500 compliant core, provided with at least one core-level instruction register. At least one of the dies in the stack may comprise at least one other die stacked thereon and the register chain may be a hierarchical instruction register chain adapted for operation such that a die-level instruction register instruction determines whether the die-level instruction register of the at least one other die is bypassed.

In a further aspect, there is a method for testing a stack of dies. The method comprises applying a test signal to a die of the stack at a first side thereof, routing the test signal through interconnections between the die and an adjacent die, and receiving a test response from the die at the first side.

A method according to one aspect may comprise performing a plurality of tests including pre-bond die tests and/or post-bond stack tests.

In one aspect, a method for testing a plurality of stacked dies interconnected by means of through-substrate vias (TSV) is presented. The method comprises performing a sequence of tests in a 3D-SIC, the stack comprising a plurality of test wrapper units, each test wrapper unit being associated with one of the dies. The method comprises operating the test logic in a test mode to implement the testing of the dies/stack/interconnection.

The 3D-SIC test flow or sequence of tests comprises (1) pre-bond die tests and (2) post-bond stack tests. The pre-bond die tests are wafer tests; the post-bond stack tests can be carried out on both unpackaged as well as packaged stacks. A test of a stack might consist of (re-)tests of the various dies, as well as tests of the TSV-based interconnects between the dies. The 3D-SIC test access architecture according to one aspect supports all these tests. When testing unpackaged stacks, it is possible not only to test the complete stack, but also to test partial stacks. Furthermore the test access architecture supports external interconnect testing, once the 3D-SIC is mounted on a board.

The test flow comprises modular tests. A modular test considers the various dies and TSV-based interconnect layers as separate test units; complex dies may be further sub-divided in multiple finer-grain test modules, e.g., embedded cores. Modular testing for 3D-SICs comes with the following benefits: (1) different tests for various modules of heterogeneous products, (2) test of black-boxed IP, (3) divide-and-conquer test generation and application, and (4) test reuse, (5) flexibility in optimizing the test set per step of the test flow ("how often do we re-test a module?"), and (6) first-order diagnosis ("which module of the stack contains the fault?").

Modular testing is enabled by using wrapper units, providing controllability and observability at the boundary of the module-under-test and predetermined/selected test signals (implemented in a Test Access Mechanism (TAM)) for transporting the test data from the chip's probe pads or pins to the module-under-test and vice versa.

A 3D-SIC comprises dies which are scan testable; for example, this can include scan-tested digital logic, BIST-ed embedded memories (built in self-test), or even scan-enabled analog cores. Furthermore, for board-level interconnect testing the overall product can be IEEE 1149.1 compliant on its external pins. Additional TSV-based interconnects between tiers for the purpose of test may be added (such additional TSV-based interconnects are relatively affordable; e.g., TSVs can be made at a 10 µm minimum pitch).

In yet another aspect, there is a method for designing a testable die, the method comprising receiving a software representation of the die, and modifying the software representation of the die by adding a first input port for receiving test stimuli and a first output port for sending test responses, the first input port and the first output port being located at a same side of the die, by providing a data signal path within the die between the first input port and the first output port, by adding at least one second output port for sending test stimuli towards another die and at least one second input port for receiving test responses from the another die, and by providing a data signal path within the die between the first input port and at least one of the second output ports, and a data signal path within the die between at least one of the second input ports and the first output port.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

Particular embodiments of the present invention are described below in conjunction with the appended drawing figures, wherein like reference numerals refer to like elements in the various figures, and wherein.

DETAILED DESCRIPTION OF CERTAIN ILLUSTRATIVE EMBODIMENTS

Figure 1:
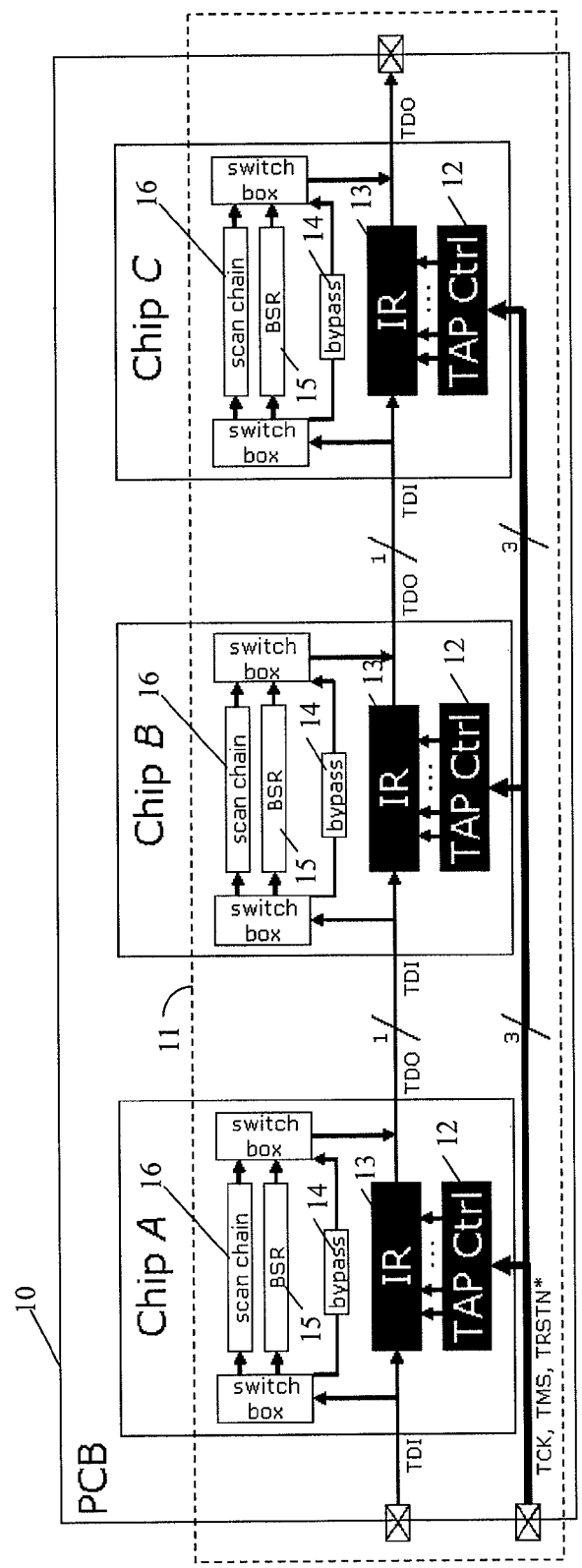
FIG. 1 illustrates a prior art board-level test access architecture for chips based on IEEE 1149.1.
Figure 2:
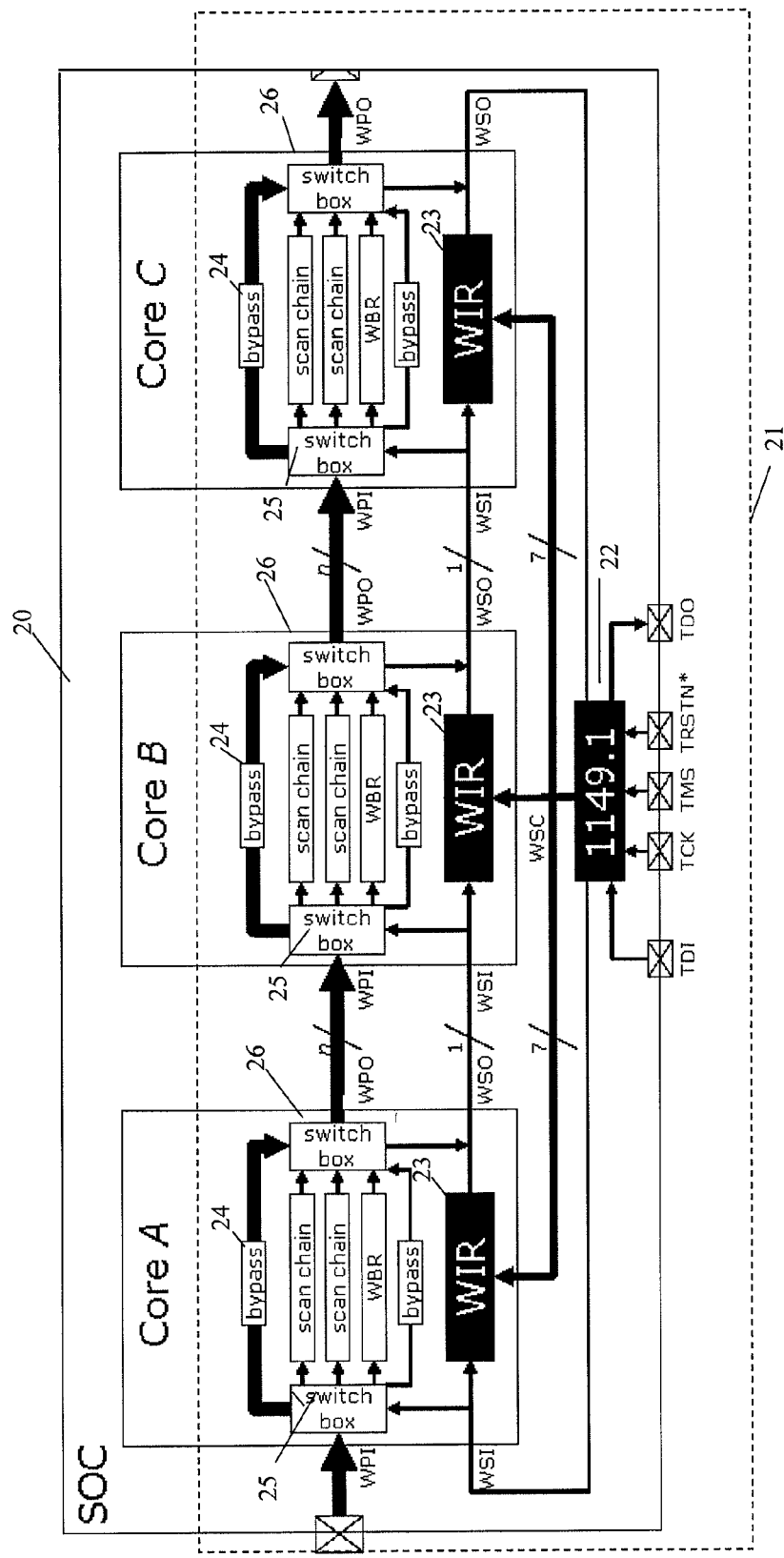
FIG. 2 illustrates a prior art SOC-level test access architecture for cores based on IEEE 1500.

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes.

Furthermore, the terms first, second, third and the like in the description, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description are used for descriptive purposes and not necessarily for describing relative positions. The terms so used are interchangeable under appropriate circumstances and the embodiments of the invention described herein can operate in other orientations than described or illustrated herein.

The term "comprising" should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting of only components A and B. It means that with respect to the present invention, the only relevant components of the device are A and B. New process technology developments enable the creation of three-dimensional stacked ICs (3D-SICs) interconnected by means of through-substrate vias (TSVs). One embodiment of the present invention relates to a device for test (DfT) test access architecture for such 3D-SICs that allows for both pre-bond die testing and post-bond stack testing.

The DfT architecture according to embodiments of the present invention is based on a modular test approach, as opposed to a test in which the entire stack is tested as one monolithic entity. In a modular test approach in accordance with embodiments of the present invention the various dies, their embedded IP cores, the inter-die TSV-based interconnects, and the external I/Os can be tested as separate units to allow optimization of the 3D-SIC test flow. Modular testing for 3D-SICs has the following advantages: (1) different tests for various modules of heterogeneous products, (2) test of black-boxed IP, (3) divide-and-conquer test generation and application, (4) test reuse, (5) flexibility in optimizing the test set per step of the test flow ("how often do we retest a module?") and (6) first-order diagnosis ("which module of the stack contains the fault?"). The latter is all the more important given the likelihood that multiple companies contribute to the manufacturing of a single 3D-SIC. The modular test approach is enabled, in accordance with embodiments of the present invention, by a DfT architecture comprising wrapper units that provide controllability and observability at the boundary of a module-under-test and Test Access Mechanisms (TAMs) that transport the test data from the chip's probe pads or pins to the module-under-test and vice versa. The wrapper units are test structures adapted for providing test access to an individual die in the stack.

The architecture according to embodiments of the present invention may build on and reuse existing DfT hardware at the core, die, and product level. This minimizes substrate, e.g. silicon, area. Test access is provided to an individual die stack via a test structure called a wrapper. The wrapper resides at the boundary of the die and provides a way to test the die, the interconnections between the dies and the complete stack. It adds a die-level wrapper, with one or more of the following features: (1) a scalable number of dedicated probe pads on the non-bottom dies to facilitate pre-bond die testing, (2) a signal path from one die to another, adjacent die, also called TestElevators, for transportation of test control and data signals up and down during post-bond stack testing, TestElevators allowing on non top dies mirroring of an image of a test interface towards a higher die, (3) a signal path within a die, also called TestTurn, for providing a test interface with signal paths going in and out the die at a single side of that die, (4) a serial (1-bit) test access mechanism for instructions and data and optionally a parallel (n-bit) test access mechanism for high-bandwidth data, and/or (5) a hierarchical Wrapper Instruction Register (WIR) chain.

Figure 3:
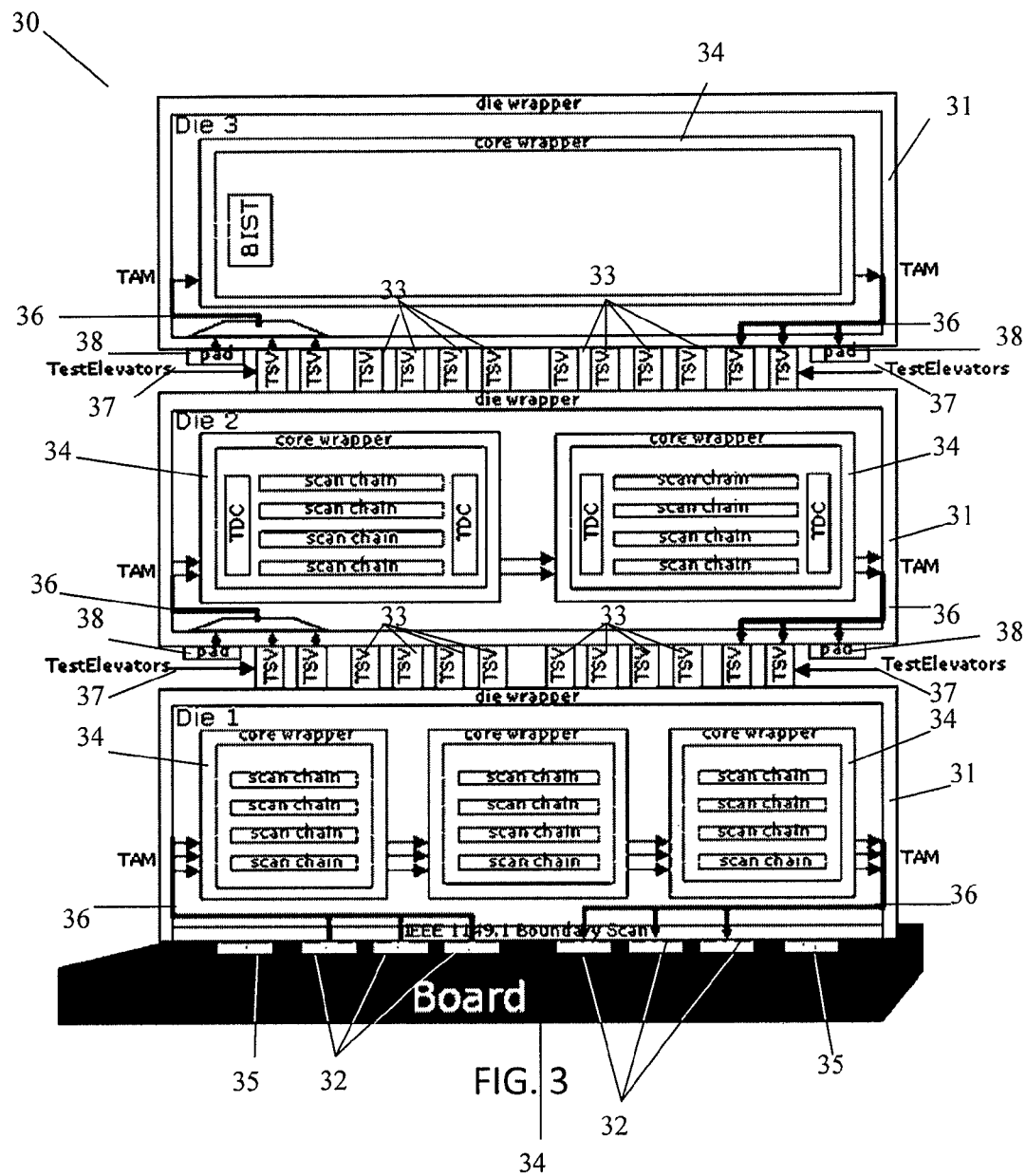
FIG. 3 is a conceptual overview of a stack of dies comprising a 3D DfT architecture according to embodiments of the present invention.

A 3D DfT architecture according to embodiments of the present invention is illustrated in a conceptual overview in FIG. 3. The 3D DfT architecture 30 comprises a set of cooperating die-level test wrappers 31, one for each die Die 1, Die 2, Die 3 in the stack. FIG. 3 shows an example stack consisting of three dies; this, however, not being intended to limit the invention in any way. The functional I/Os of the three dies Die 1, Die 2, Die 3 are to be found in the middle at the bottom of the dies. In the middle at the bottom of bottom die Die 1 are the external I/Os 32 ('pins'). The dies are interconnected by means of functional TSVs 33. In the embodiment illustrated, each core Core 1.1, Core 1.2, Core 1.3, Core 2.1, Core 2.2, Core 3 within a die Die 1, Die 2, Die 3 is provided with conventional, already existing design-for-test infrastructure 34. The external I/Os 32 of the stack, all located in the bottom die Die 1, are, as an example only, wrapped by IEEE 1149.1 Boundary Scan. This requires a limited number of additional pins 35, of which two (TDI and TDO) are shown. Furthermore, the dies have existing intra-die DfT, exemplified by internal scan chains, test data compression (TDC), built-in self test (BIST), IEEE 1500-compliant core wrappers, and/or test access mechanisms (TAMs).

The test wrappers 31 around the dies in the stack form part of the 3D DfT test architecture according to embodiments of the present invention. Main features of the die-level wrapper 31 are (1) TestTurns 36 in every die, adapted for feeding test data back to the external pins in the bottom die, and/or (2) TestElevators 37 between dies, adapted for propagating test signals up and down through the stack. Supplementary and optional features of a die-level wrapper 31 according to embodiments of the present invention may be (3) a serial interface for receiving and/or sending wrapper instructions and low-bandwidth data, optionally supplemented by a scalable, parallel interface for receiving and/or sending higher-bandwidth test data, (4) a scalable number of dedicated probe pads 38 on non-bottom dies, preferably on all non-bottom dies, to enable pre-bond die testing of these dies, and/or (5) a hierarchical test control mechanism for controlling the test mode of each die and for optionally opening up for controlling possible embedded cores within a particular die.

The architecture in accordance with embodiments of the present invention is scalable in the sense that its design parameters can be optimized for varying core, die, and stack parameters. The prior work published until now did not identify how existing DfT standards and test access architectures can be leveraged. Test control and instructions were ignored in the prior work.

An access mechanism can provide functional access and/or test access. Typically, this is a mechanism by which signals may be propagated to and from a core (or die), from either embedded circuitry or from the primary inputs and outputs of the system chip. A test access mechanism is typically a feature of a system-on-chip (SoC) design that enables the delivery of test data to and from cores (or dies) or wrappers.

Figure 4:
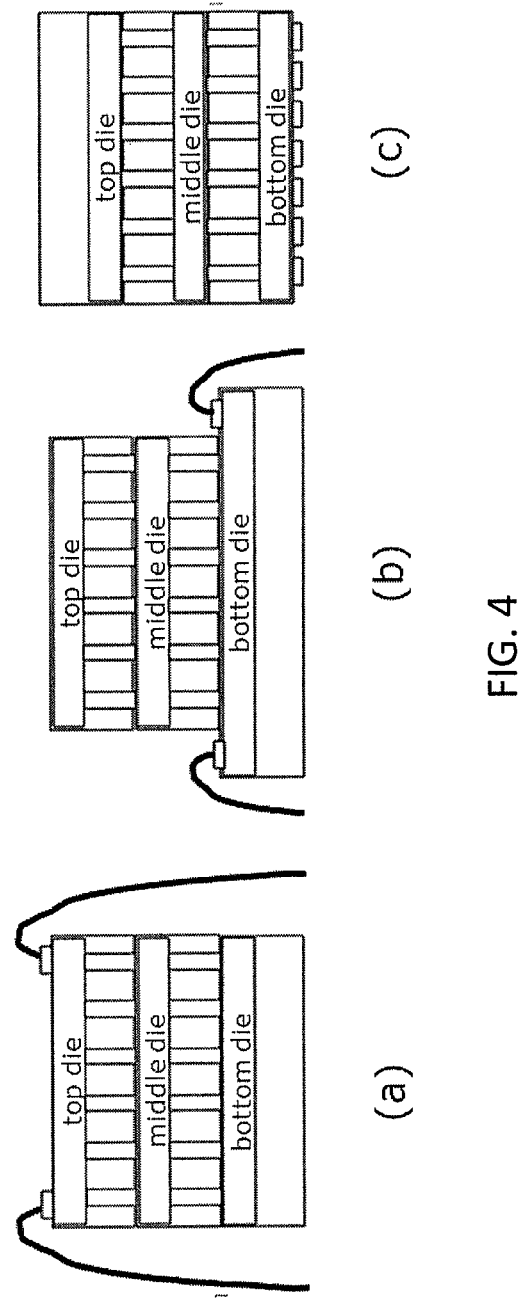
FIG. 4 shows different options for 3D-SIC external connections.

In one embodiment, three types of 3D-SICs are considered; examples of these types (in this case for stacks of three tiers) are depicted in FIG. 4. The three types differ in their connections to the external world ('pins'): (a) wire-bond from the top die, (b) wire-bond from the bottom die, and (c) flip-chip connections from the bottom die. All three types have in common that only one side of one of the extreme tiers (top or bottom) holds all external connections. In the remainder of the disclosure it is assumed, for simplicity only, that all external connections are in the bottom die. This assumption is without loss of generality, as one can always swap the references to top and bottom die. Hence, in accordance with embodiments of the present invention, that die in a stack which contains the external connections, is called the bottom die.

In one embodiment, the proposed test access architecture for 3D-SICs is based on a die level wrapper, called test wrapper unit. As an example, this die level test wrapper unit may be based on an existing DfT standard, for example it may be an extended version of IEEE 1500 or of IEEE 1149.1. A test architecture according to embodiments of the present invention comprises a plurality of test wrapper units, each test wrapper unit being associated with one of the dies in the stack. For accessibility reasons, the test wrapper unit may reside at the boundary of a die. The die-level test wrapper unit provides a consistent external interface to other dies in the stack, while internally within the die it connects up to the existing functional circuitry and regular intra-die DfT. The architecture may use a limited, scalable number of dedicated TSV-based interconnections between dies in addition to the already existing functional interconnects.

Embodiments of the present invention include dies comprising test circuitry (a test wrapper unit) for testing that die and/or for testing, when the die is stacked, interconnections between that die and an adjacent die. The test circuitry comprises a first input port for receiving test stimuli and a first output port for outputting test responses, the first input port and the first output port being located at a same side of the die, there being a data signal path within the die between the first input port and the first output port; and at least one second output port for sending test stimuli towards another die and at least one second input port for inputting test responses from the another die, there being a data signal path within the die between the first input port and the at least one second output port, and a data signal path within the die between the at least one second output port and the first output port.

Figure 5:
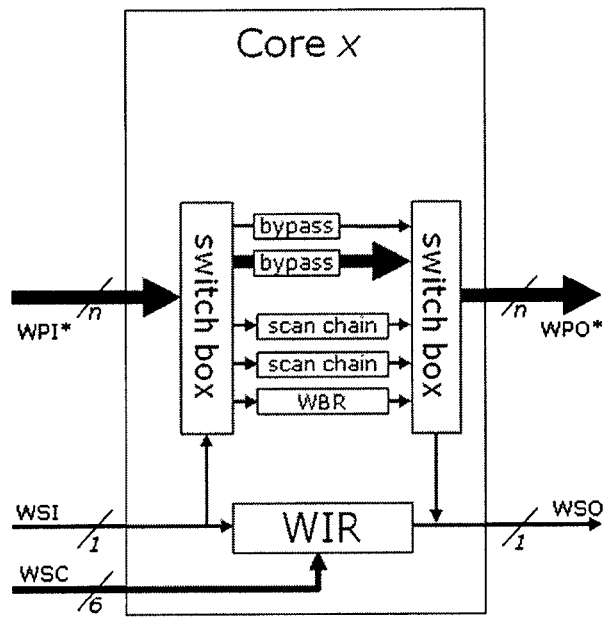
FIG. 5 illustrates a prior art IEEE 1500 wrapper for a core.

IEEE std 1500 standardizes a test wrapper for embedded cores in an SOC. FIG. 5 shows a conceptual view of an IEEE-compliant wrapper. It has two test access ports. A single-bit (serial) port WSI-WSO is mandatory and used for both loading wrapper instructions as well as for low-bandwidth test data. An optional, scalable (parallel) port WPI-WPO can carry higher bandwidth test data. The combination of a pseudo-static wrapper instruction, shifted into the wrapper instruction register (WIR), and the values of the wrapper serial control (WSC) signals determine the operation of the wrapper. The wrapper has an inward-facing test mode for testing the embedded core itself ('Intest'), as well as an outward-facing test mode for testing the circuitry external to the embedded core ('Extest'). In both modes, the wrapper boundary register (WBR) is activated to apply stimuli and capture responses. The wrapper can also activate its 'Bypass' mode, for example to test another core in the SOC.

Figure 6:
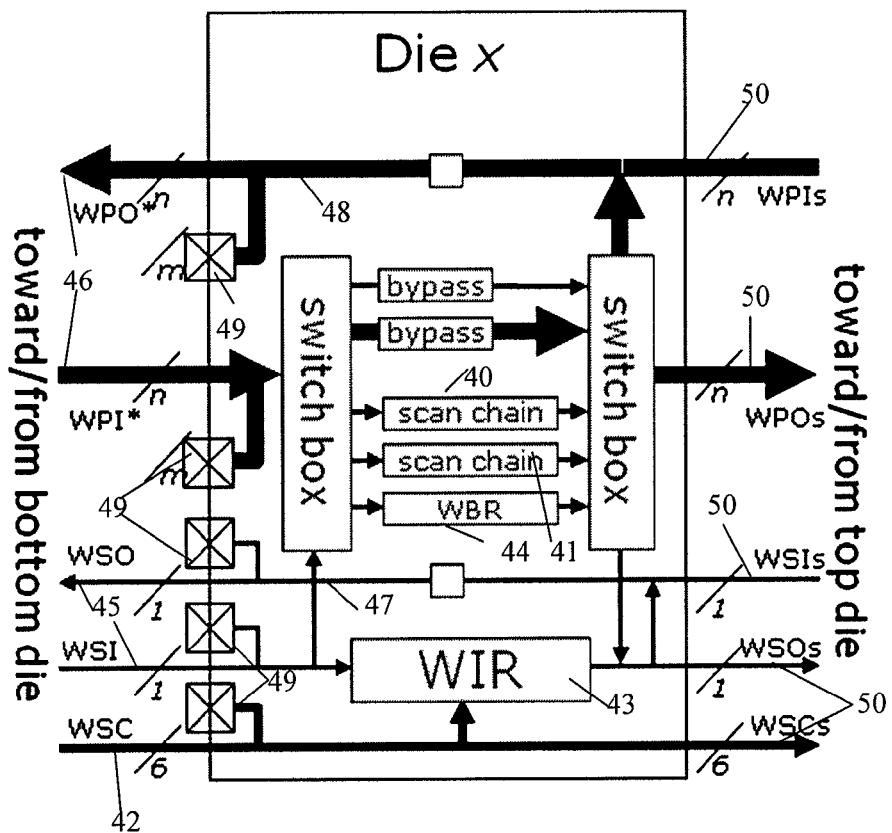
FIG. 6 shows a schematic of a die-level wrapper according to embodiments of the present invention.

FIG. 6 shows a schematic overview of the DfT structures and additional interconnects according to embodiments of the present invention for an arbitrary Die x in the middle of a stack. Hence Die x neither is a bottom die, nor a top die. The figure abstracts from the functional circuitry and interconnects, and only shows the DfT structures.

It shows two internal scan chains 40, 41, which are representative for the possible die internal DfT, such as any number of scan chains for a monolithic design, TAMs for a core-based SOC design, and/or BIST-ed logic or memory. Die x is provided with a standard test wrapper. The embodiment illustrated, as an example only, is equipped with an IEEE 1500-like wrapper that is normally encountered with embedded IP cores. The figure shows the conventional IEEE 1500 features of that die-level wrapper: a seven-bit wrapper serial control (WSC) 42, a wrapper instruction register (WIR) 43, a wrapper boundary register (WBR) 44, a serial WSI-WSO interface 45 for instructions and low bandwidth test data, and parallel WPI-WPO interface 46 for test data. It is to be noted that it is preferred that the entire interface of the standard test wrapper, e.g. the entire IEEE 1500 interface, is situated at the bottom side of the die.

In one embodiment, the die-level wrapper according to embodiments of the present invention has following 3D-SIC-specific features, as illustrated in FIG. 5:

1. Control and data signals of the standard test wrapper, e.g. of IEEE 1500 (WSC, WSI, WSO, WPI, and WPO), enter and exit Die x via TSV-based interconnects from/to the die below Die x for post-bond stack testing, as test access for post-bond stack test according to embodiments of the present invention is only possible via the bottom die. To this end, the signal paths 47, 48 for test control and test data have a U-turn type of shape. They are also referred to herein as TestTurns. To this end, the die Die x is provided with a first input port for receiving test stimuli and a first output port for outputting test responses, the first input port and the first output port being located at a same side of the die, there being a data signal path 47, 48 within the die between the first input port and the first output port. In the output path towards WSO and WPO, pipeline registers may be inserted for a clean timing interface, which may be especially advantageous if many dies are stacked.

2. Control and data signals of the standard test wrapper, e.g. IEEE 1500, can be transferred to a die above Die x via a set of signals with identical names, postfixed with the letter 's' (for 'stack'): WSCs, WSIs, WSOs, WPIs, and WPOs. The signal paths 50 are also called herein TestElevators, and are all situated on the top side of the die. The TestElevators comprise a new type of DfT hardware that includes TSVs. They are used to reach dies higher up in the stack. The TestElevators are used for transporting test control and data signals up and down during post-bond stack testing. To this end, the die Die x is provided with at least one second output port for sending test stimuli towards another die and at least one second input port for inputting test responses from the another die, there being a data signal path within the die between the first input port and the at least one second output port, and a data signal path within the die between the at least one second input port and the first output port.

3. In particular embodiments of the present invention, control and data signal paths of the standard test wrapper, e.g. of IEEE 1500 (WSC, WSI, WSO, WPI, and WPO), may be equipped with dedicated probe pads 49 for facilitating pre-bond die testing. This is particularly advantageous as long as probe technology does not provide us with solutions to safely probe micro-bumps and/or TSV tips and landing pads. These probe pads are especially desired on the serial interface (WSC, WSI-WSO), and optional and scalable on the parallel interface (WPI-WPO). If the parallel WPI-WPO interface coming from the bottom is n-bits wide (with n≥0), the corresponding probe pad interface can be m bits wide, with 0≤m≤n. In FIG. 6, for easy figure layout, these probe pads 49 are drawn on the bottom side; however, that does not imply that these probe pads 49 need to be physically located at the bottom side of the die. It is to be noted that the width of the parallel interface WPI-WPO might be chosen differently for the TSV interconnects (n) and probe pads (m).

Figure 9:
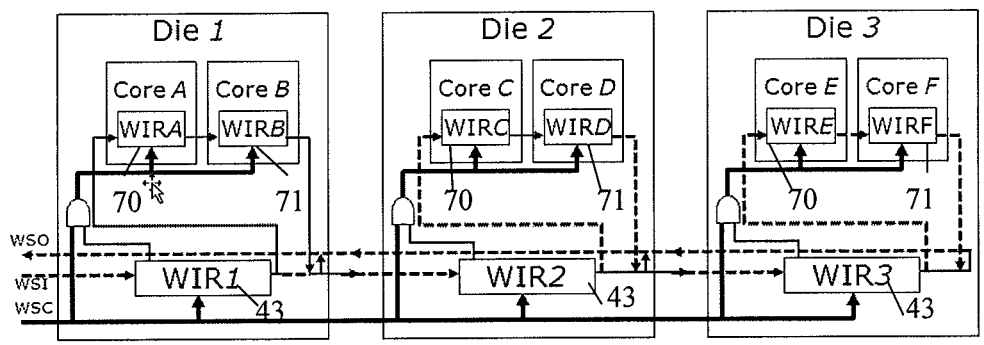
FIG. 9 illustrates a first example of a test mode according to embodiments of the present invention.

4. To prevent unbridled lengthy WIR chains, hierarchical WIR chains may be implemented according to particular embodiments of the present invention. This is further described and depicted in FIG. 9. A concatenation of WIR as implemented in IEEE 1500 would make the total WIR chain length depend on the numbers of dies in the stack, the number of embedded cores with WIRs per die, and the summed length of the various WIR instructions. To prevent an unbridled growth of the overall WIR chain length for 3D-SICs, the die level WIRs according to embodiments of the present invention may be provided with a control bit that allows to bypass the core-level WIRs within that die. This hierarchical WIR mechanism, which opens up as needed similar to a harmonica, is shown in FIG. 9.

Figure 7:
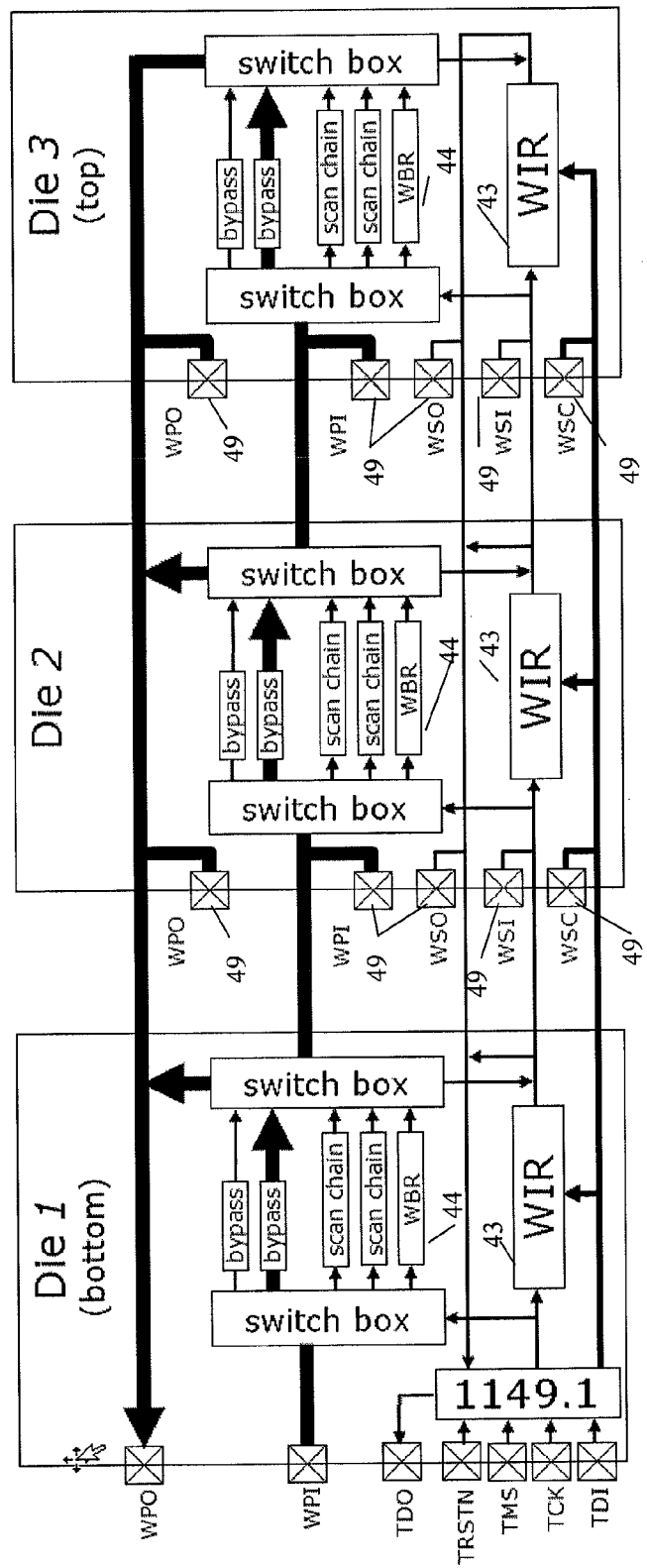
FIG. 7 shows a 3D-SIC test access architecture according to embodiments of the present invention.

FIG. 7 shows a 3D DfT architecture with IEEE 1500-based die wrappers according to an embodiment of the present invention for a stack of three dies. The WSC control signals are broadcast to all dies. The serial and parallel mechanisms are daisy-chained throughout the stack.

The middle die has a wrapper according to embodiments of the present invention, as set out above. The die wrappers for the top and bottom dies are slightly different.

The DfT in a bottom die (as for example Die 1 illustrated in FIG. 6) differs from the DfT in a middle die (as for example Die x illustrated in FIG. 6) in the following aspects:

Dedicated pre-bond probe pads are not required. Instead, the functional external I/O pads can be used for probe access.

The bottom die may be equipped with a standard test wrapper, e.g. an IEEE 1149.1, to facilitate board level testing and provide a board-level test and debug port. The JTAG boundary scan chain may include all external I/Os of the 3D-SIC product.

The serial IEEE 1500 interface (WSC, WSI, and WSO) can be multiplexed onto the IEEE 1149.1 Test Access Port (TAP). This saves otherwise dedicated pads, and makes the 3D test access architecture accessible even when the 3D-SIC is soldered onto a PCB.

The parallel IEEE 1500 interface (WPI and WPO) can be multiplexed onto the functional external I/O pads, similar to what is common for scan chains and parallel TAMs in 2D-SOCs. This saves otherwise dedicated pads, but restricts the TestElevator width to the available functional I/O.

The DfT in a top die (as for example Die 3 illustrated in FIG. 6) differs from the DfT in a middle die in (as for example Die x illustrated in FIG. 6) the following aspect.

The die does not have TSV-based interconnects to an even higher level die, as it is the top die. Hence the top die does not need to be provided with at least one second output port and at least one second input port. Hence, the top-side TestElevators WSCs, WSIs, WSOs, WPIs, and WPOs may be absent.

In accordance with embodiments of the present invention, testing may take place before and/or after stacking the dies; such test are referred to as pre-bond tests and post-bond tests, respectively. For both types of tests a test access is needed, in order to apply test stimuli and observe test responses. The test access for pre-bond and post-bond testing, however, is distinctively different.

For pre-bond testing of a die intended to be a bottom die of a stack, the functional I/Os may be used. However, as only the external I/O connections for wire-bonds or flip-chip bumps are large enough to be probed with conventional probe equipment, the other dies that are intended to fit in the middle or the top of the stack may not have conventional probe points. In some embodiments, their functional connections are through TSVs only, and TSV tips and landing pads are too small to be probed, and often also too numerous and too sensitive to probe damage. Hence, for pre-bond testing, in accordance with embodiments of the present invention, dies may be provided with additional dedicated probe pads for pre-bond testing.

For post-bond testing, the above-mentioned additional dedicated probe pads on the middle and top dies of the stack cannot be used anymore, as they are physically inaccessible once the die stack is formed. In accordance with embodiments of the present invention, test access goes through the conventional external I/O connections at the bottom die and through (reused or dedicated) TSVs that carry the test data up- and downwards.

Hence, each non-bottom die in a stack according to embodiments of the present invention has a test access architecture (comprising wrappers, TAMs, scan chains, etc.) with two separate entry and exit points (dedicated probe pads and TSVs).

A select control signal needs to be provided to switch between the two test configuration modes that use one of these two access points. This is a pseudo-static test mode configuration signal that remains stable during an entire test. Such pseudo-static test mode configuration signals are typically provided as an output of the die-level WIR (IEEE 1500) or the die-level IR (IEEE 1149.1). However, also the (W)IR instructions are loaded from one of these two entry points; also the WSI (TDI) input for the WIR (IR) comes via a pad or TSV. Hence, the signal cannot be obtained from the (W)IR itself and needs to come from somewhere else.

In accordance with embodiments of the present invention, a die furthermore comprises a small, non-intrusive circuit that automatically detects whether the die is in either a pre-bond or a post-bond situation, and generates an on-chip pre-bond/post-bond select signal accordingly.

Figure 24:
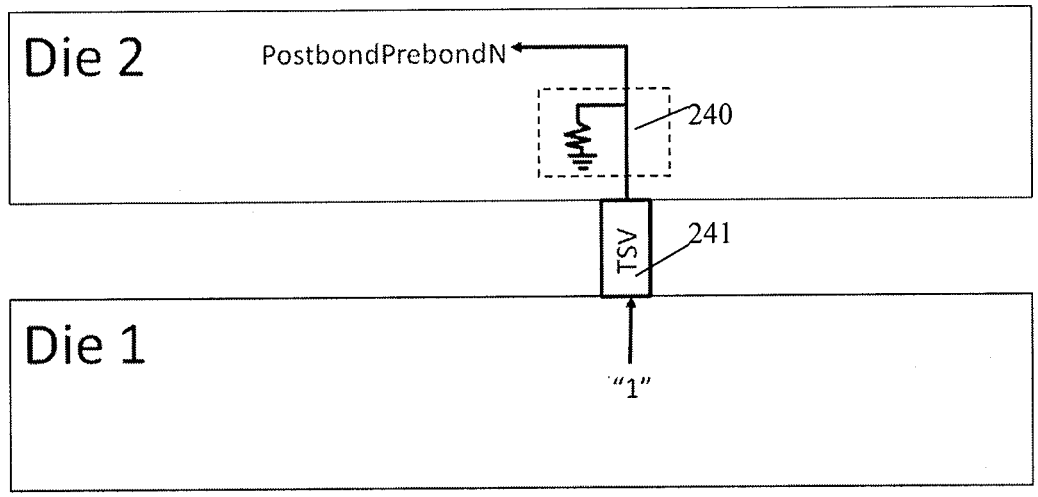
FIG. 24 to FIG. 30 are illustrations of circuits in accordance with embodiments of the present invention that automatically detect whether a die is in a pre-bond or in a stacked configuration.

In a first implementation, such circuit is illustrated in FIG. 24. It shows two dies, Die 1 and Die 2. In Die 1, a hard logic "1" is implemented, while in Die 2 a pull down 240 is implemented. If Die 2 is standalone (pre-bonding), no signal is applied to the TSV 241 and the pull down 240 pulls down the output signal PostbondPrebondN to a logic "0", indicating that Die 2 is in a pre-bond configuration. If, on the other hand, Die 1 and Die 2 are stacked, the hard logic "1" is applied to the TSV 241. Despite the pull down 24, the output signal PostbondPrebondN will be a logic "1", indicating that Die 2 is in a stacked configuration.

Figure 25:
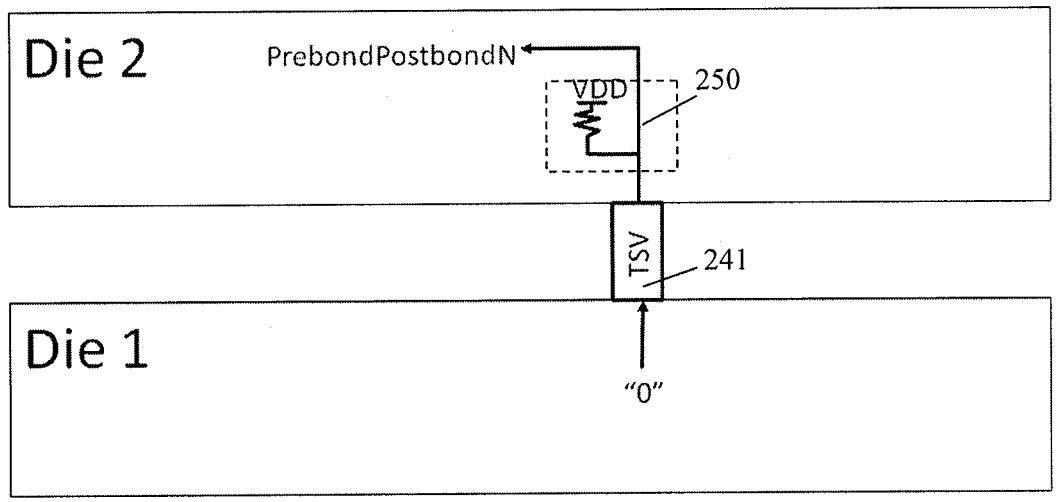

Another implementation is illustrated in FIG. 25, which is similar to the implementation of FIG. 24, but where in Die 1 a hard logic "0" is implemented. In Die 2 a pull up 250 is implemented. If Die 2 is standalone (pre-bonding), no signal is applied to the TSV 241 and the pull up 250 pulls up the output signal PostbondPrebondN to a logic "1", indicating that Die 2 is in a pre-bond configuration. If Die 1 and Die 2 are stacked together, the hard logic "0" is applied to the TSV 241. Despite the pull up 250, the output signal PostbondPrebond N will be a logic "0", indicating that Die 2 is in a stacked configuration.

The implementations of FIG. 24 and FIG. 25 use dedicated TSV-based interconnects. The cost is limited to one dedicated interconnect and a detector circuit.

Figure 26:
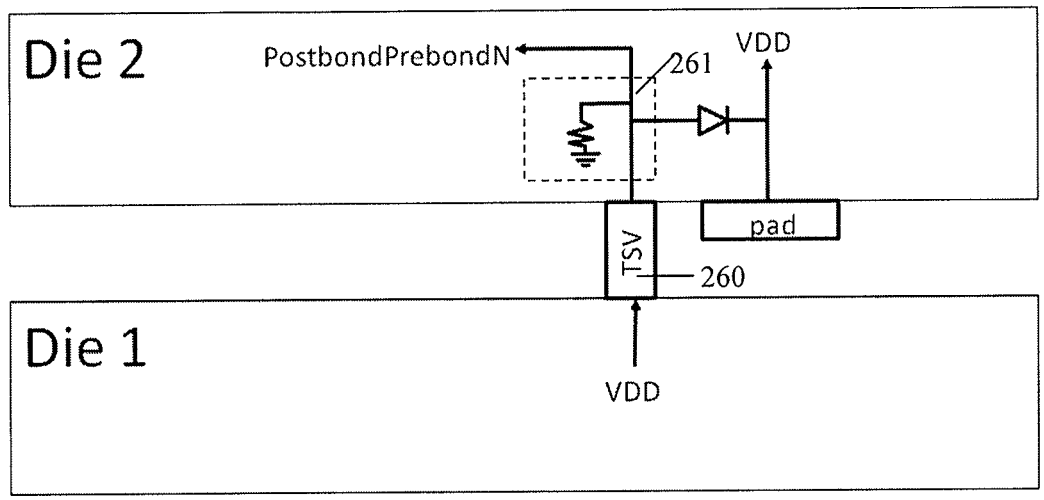
Figure 27:
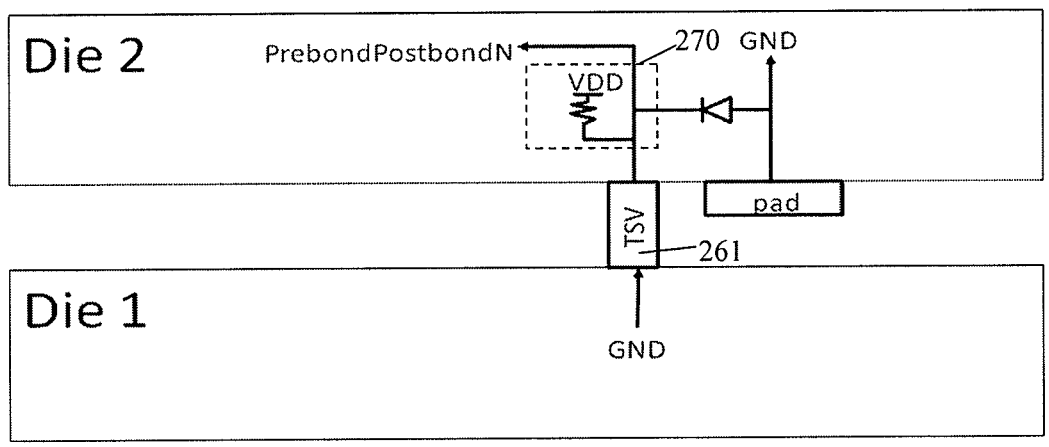

Another implementation of a circuit that automatically detects whether a die is in pre-bond or post-bond configuration and generates a select signal accordingly, is illustrated in FIG. 26 and FIG. 27. In these cases, the control signal is derived from a reused power TSV 261. A pre-bond signal is generated by means of pull down 261 or a pull-up 270, but this is overruled by a hard VDD or GND, respectively, hence high or low signal, in case a bond between Die 1 and Die 2 is established.

Figure 28:
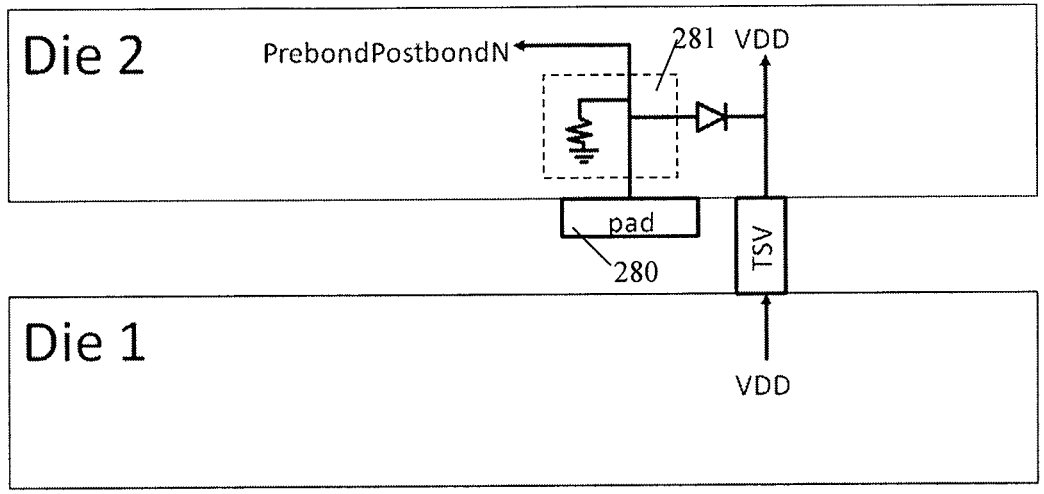
Figure 29:
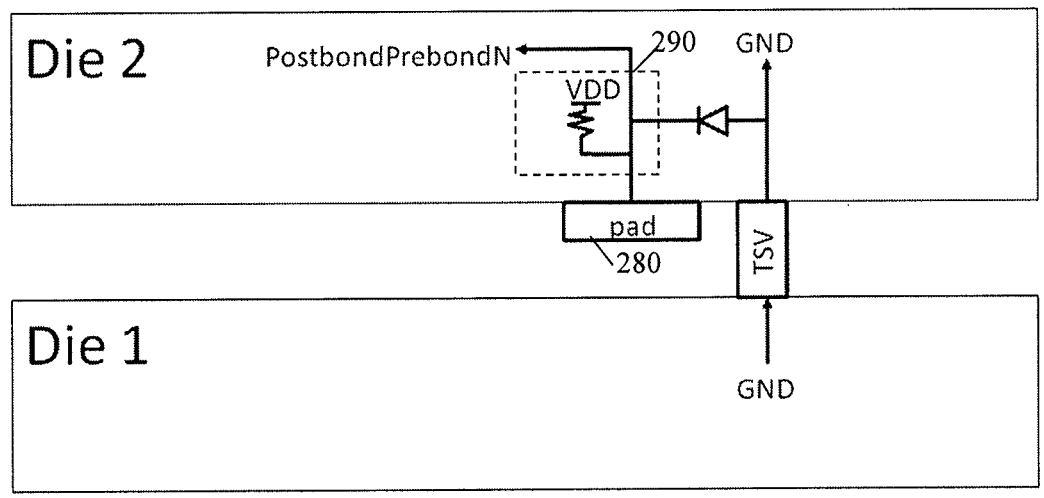

Yet another implementation of a circuit that automatically detects whether a die is in pre-bond or post-bond configuration and generates a select signal accordingly, is illustrated in FIG. 28 and FIG. 29. In these cases, the control signal is derived from a reused power pad 280. A pre-bond signal is generated by means of pull down 281 or a pull-up 290, but this is overruled by a hard VDD or GND, respectively, hence high or low signal, in case the pad 280 is probed, hence a bond between Die 1 and Die 2 has not been established yet.

Figure 30:
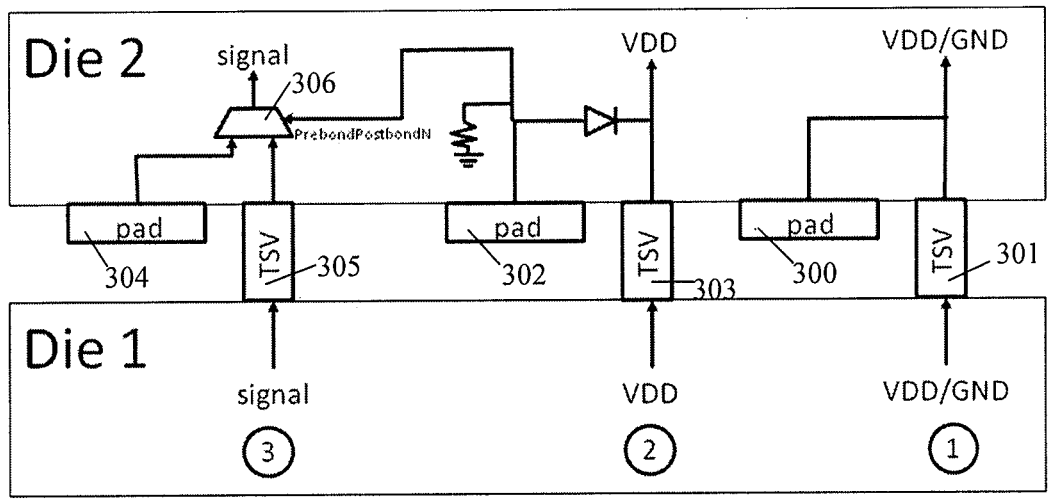

Another implementation is illustrated in FIG. 30. For all but one power and ground lines the pad 300 and the TSV 301 for a same line are electrically connected. In the embodiment illustrated, one dedicated VDD input, both the pad 302 and the TSV 303, is coupled to detector circuitry, for example detector circuitry as illustrated in FIG. 28. In an alternative embodiment it could for example be one dedicated GND input which is coupled to detector circuitry, for example detector circuitry as illustrated in FIG. 29. Furthermore, for all signal pads 304 and signal TSVs 305, a multiplexer 306 is provided for electrical selection between the signal pad 304 and the signal TSV 305, depending on the configuration of Die 2 as a standalone die (pre-bond) or as a die in a stack (post-bond). The select control signal PrebondPostbondN is obtained from detector circuitry according to embodiments of the present invention, in the embodiment illustrated in FIG. 30 detector circuitry as in FIG. 28.

FIG. 7 depicts the test access architecture for an example 3D-SIC containing three dies; Dies 1, 2, and 3 are respectively the bottom, middle, and top die of the stack. For ease of illustration the dies are shown next to each other, instead of as a vertical stack.

This test access architecture requires 7+2+2 m dedicated probe pads 49 at each (non-bottom) die in the stack. As the parallel TAM is optional in IEEE 1500, it is to be noted that m can be zero. This number of dedicated probe pads 49 needs to be extended by all required infrastructural pads for power, ground, clocks, etc.; these are not shown in FIG. 7, although for proper operation their presence is obviously essential.

Figure 8:
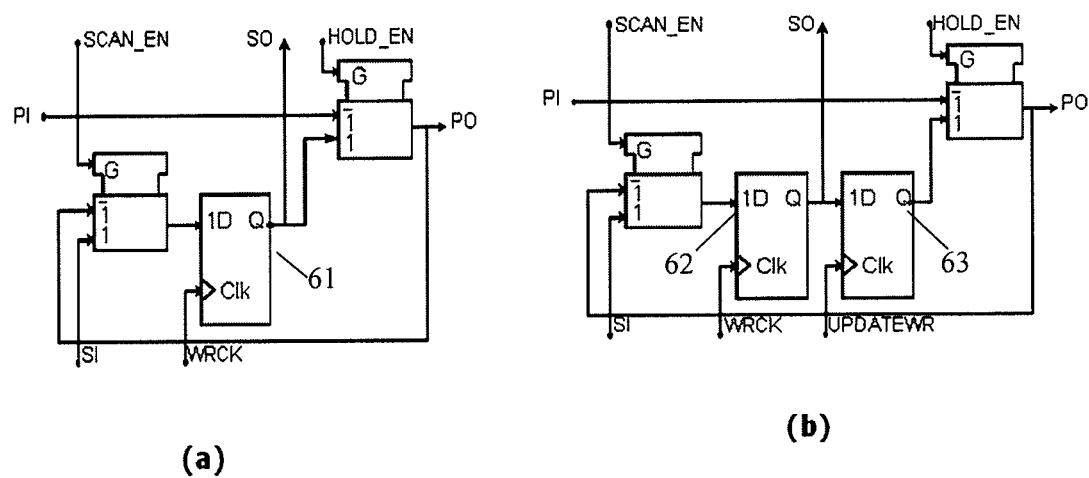
FIG. 8 shows possible wrapper boundary register (WBR) cells according to embodiments of the present invention.

IEEE 1500 allows various types of wrapper cells in its WBR 44. Embedded cores in 2D-SOCs commonly use the cell depicted in FIG. 8(a); it comprises only a single flip-flop 61 and hence occupies little substrate, e.g. silicon, area. For the WBR chain of the proposed 3D-SIC die-level wrapper, (also IEEE 1500-compliant) a double flip-flop wrapper cell may be used as shown in FIG. 8(b). This wrapper cell comprises two flip-flops 62, 63. At the expense of an extra flip-flop, this wrapper cell provides ripple-protection during shift mode, which seems appropriate especially if the various dies come from different sources, and ripple-during-shift might result in unwanted signal combinations at the inter-die interfaces.

Loading instructions into a WIR 43 of a die-level wrapper is comparable to what is known from IEEE 1500-compliant cores in 2D-SOCs. While a new instruction is shifted into the WIR 43, the previous instruction remains valid; only once fully arrived in place, the new instruction is activated by pulsing an UPDATEWR signal. In IEEE 1500, the WIRs of multiple IP cores are to be concatenated in a single WIR chain, which allows different cores to be loaded with different instructions. For 3D-SICs, a single concatenated WIR chain might become very lengthy, especially in case the individual dies are core-based SOCs with their own concatenated WIR chain segments. Hence, in accordance with embodiments of the present invention, a hierarchical WIR mechanism may be used, which opens up as needed, similar to a harmonica. Initially, the WIR chain only comprises the die-level WIRs 43. Once loaded with die-level instructions, the core-level WIR chain segments 70, 71 are included in the overall WIR chain for only those dies for which the corresponding control bit was set (e.g. because one of the InTest instructions was given); subsequently, further core-level WIR instructions can be loaded. FIG. 9 schematically shows this concept by means of an example. The dashed arrows highlight the active WIR chain. In this example, Dies 2 and 3 are in an InTest mode and hence, the WIR chain also includes the WIRs 70, 71 of their cores, resp. WIRC+WIRD and WIRE+WIRF. The benefit of this hierarchical WIR mechanism is that an unbridled growth of the WIR chain length is prevented; at any moment, the WIR is only as long as needed. The cost is the requirement for the user to keep track of the current WIR chain length and a more complex procedure for loading instructions.

Figure 10:
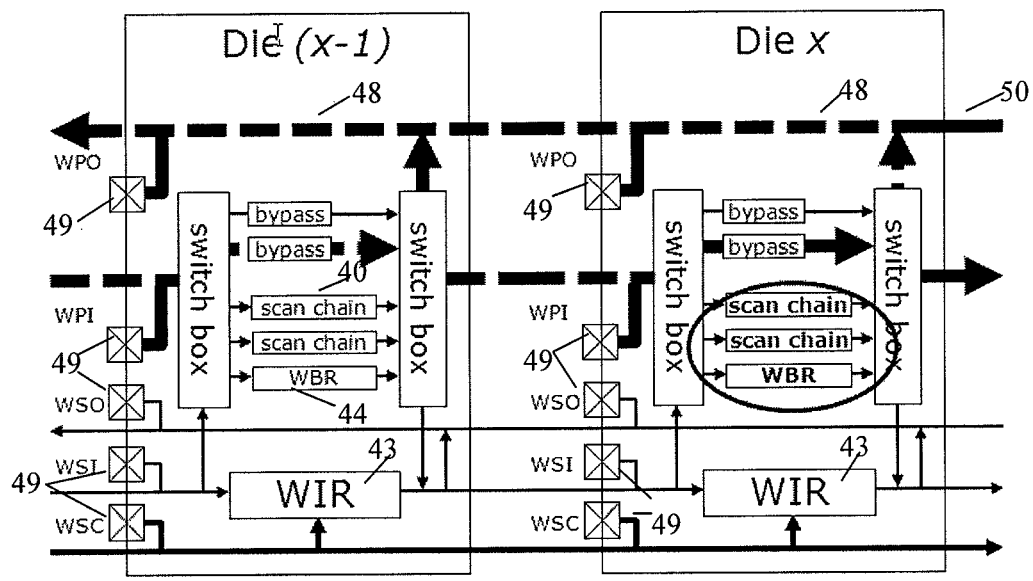
FIG. 10 illustrates a second example of a test mode according to embodiments of the present invention.
Figure 11:
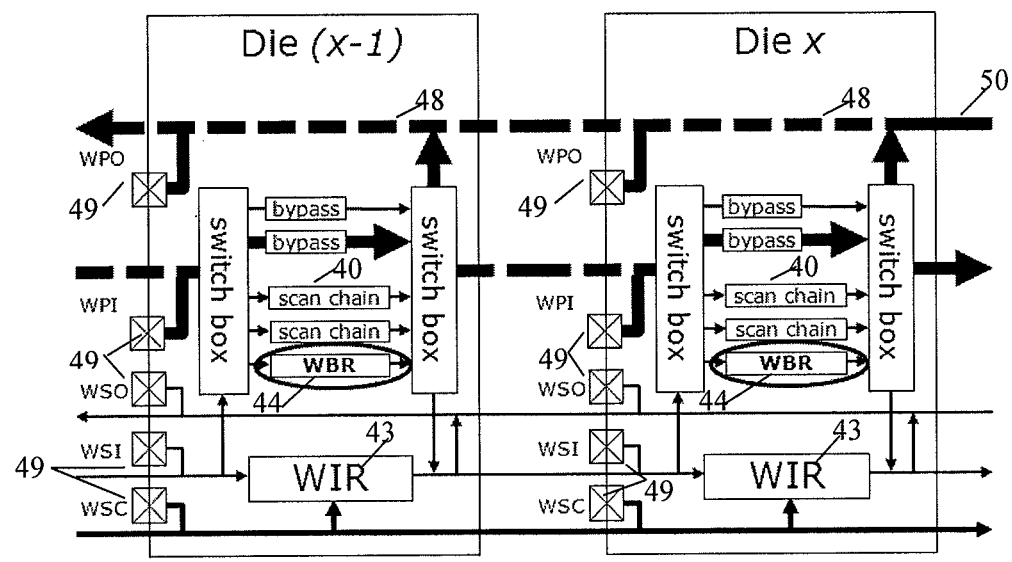
FIG. 11 illustrates a third example of a test mode according to embodiments of the present invention.

FIG. 10 and FIG. 11 show two examples of a 3D-SIC according to embodiments of the present invention in which neighbouring dies are in different operating modes. In FIG. 10, Die (x−1) is in its ParallelPostbondBypassElevator mode, while Die x is in its ParallelPostbondIntestTurn mode. This means that Die x is currently being tested, while the test data passes up and down in the stack through Die (x−1). The dashed arrows and the encircled data registers in the figure highlight the test data flow.

In FIG. 11, Die (x−1) is in its ParallelPostbondExtestElevator mode, while Die x is in its ParallelPostbondExtestTurn mode. This means that the TSV-based interconnects between Dies (x−1) and x are currently being tested. The dashed arrows and the encircled data registers in the figure highlight the test data flow.

IEEE Std 1149.1 standardizes a test wrapper for chips on a PCB. FIG. 1 shows a conceptual view of IEEE 1149.1 compliant wrappers. This drawing shows that the IEEE 1500 wrapper and IEEE 1149.1 wrapper have large commonalities, but there are also a number of significant differences.

IEEE 1149.1 only has a serial mechanism, and lacks a higher-bandwidth parallel test access mechanism.

Instead of the six-bit (or optional seven-bit) WSC control port of IEEE 1500, IEEE 1149.1 has a two-bit (or optional three-bit) control port, comprising the signals TCK, TMS and optionally TRSTN. Internally, the additional control signals are generated by stepping through a 16-state finite state machine named TAP Controller.

Figure 12:
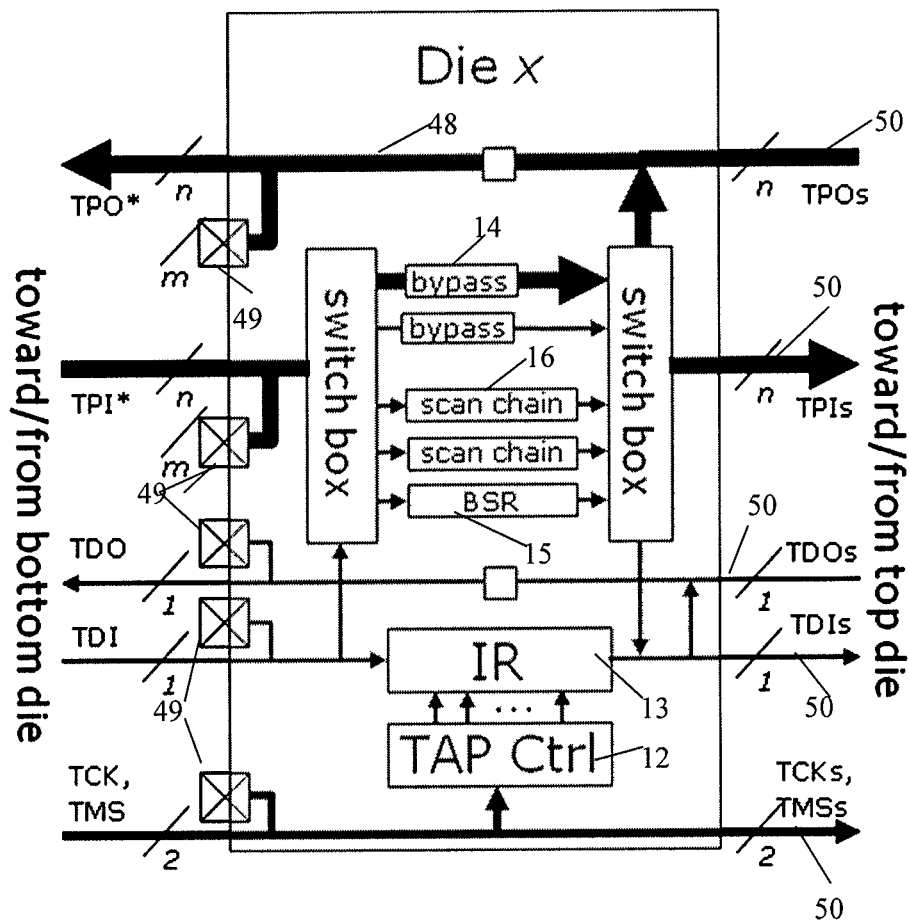
FIG. 12 illustrates a IEEE 1149.1-based wrapper according to embodiments of the present invention.

The IEEE 1149.1 chip wrapper can be used and enhanced to form a die-level wrapper for 3D-SICs in accordance with embodiments of the present invention. FIG. 12 shows such an 3D-enhanced die wrapper in accordance with embodiments of the present invention, based on IEEE 1149.1. The 3D enhancements comprise one or more of the following:

1. Control and data signals of the standard test wrapper, e.g. of IEEE 1149.1 (TCK, TMS, TDI, TDO, TPI, and TPO), enter and exit Die x via TSV-based interconnects from/to the die below Die x for post-bond stack testing, as test access for post-bond stack test according to embodiments of the present invention is only possible via the bottom die. To this end, the signal paths 47, 48 for test control and test data have a U-turn type of shape. They are also referred to herein as TestTurns. To this end, the die Die x is provided with a first input port for receiving test stimuli and a first output port for outputting test responses, the first input port and the first output port being located at a same side of the die, there being a data signal path 47, 48 within the die between the first input port and the first output port. In the output path towards TDO and TPO, pipeline registers may be inserted for a clean timing interface, which may be especially advantageous if many dies are stacked.

2. Control and data signals of the standard test wrapper, e.g. IEEE 1149.1, can be transferred to a die above Die x via a set of signals with identical names, postfixed with the letter 's' (for 'stack'): TCKs, TMSs, TDIs, TDOs, TPIs, and TPOs. The signal paths 50 are also called herein TestElevators, and are all situated on the top side of the die. The TestElevators comprise a new type of DfT hardware that includes TSVs. They are used to reach dies higher up in the stack. The TestElevators are used for transporting test control and data signals up and down during post-bond stack testing. To this end, the die Die x is provided with at least one second output port for sending test stimuli towards another die and at least one second input port for inputting test responses from the another die, there being a data signal path within the die between the first input port and the at least one second output port, and a data signal path within the die between the at least one second input port and the first output port.

3. In particular embodiments of the present invention, control and data signal paths of the standard test wrapper, e.g. of IEEE 1149.1 (TCK, TMS, TDI, TDO, TPI, and TPO), may be equipped with dedicated probe pads 49 for facilitating pre-bond die testing. This is particularly advantageous as long as probe technology does not provide us with solutions to safely probe micro-bumps and/or TSV tips and landing pads. These probe pads are especially desired on the serial interface (TCK, TMS, TDI-TDO), and optional and scalable on the parallel interface (TPI-TPO). If the parallel TPI-TPO interface coming from the bottom is n-bits wide (with n≥0), the corresponding probe pad interface can be m bits wide, with 0≤m≤n. In FIG. 12, for easy figure layout, these probe pads 49 are drawn on the bottom side; however, that does not imply that these probe pads 49 need to be physically located at the bottom side of the die. It is to be noted that the width of the parallel interface TPI-TPO might be chosen differently for the TSV interconnects (n) and probe pads (m).

4. In particular embodiments of the present invention, in order to support efficient high-volume testing of the die's circuitry, a parallel, scalable test port of user-defined width n is provided.

In this embodiment, the hierarchical WIR is achieved without any additional implementational effort. In common SOC implementations, there already exists a hierarchical relationship between a chip-level IEEE 1149.1 Instruction Register (IR) 13 and the core-level IEEE 1500 WIRs.

Figure 13:
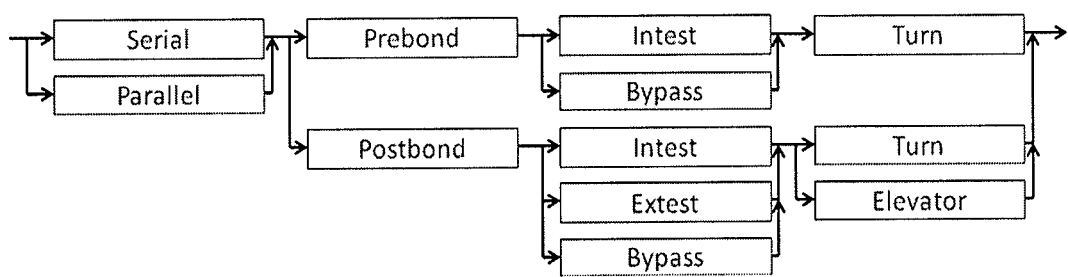
FIG. 13 is a 'railroad diagram' for operating mode set-up.

FIG. 13 shows a 3D DfT architecture according to embodiments of the present invention, with IEEE 1149.1-based die wrappers for a stack of three dies. The architecture according to this embodiment has large similarities to the one illustrated in and described with respect to FIG. 7. In fact the only major difference is the number and function of the broadcast control signals (six/seven bit WSC vs. two/three bit TCK/TMS/TRSTN) and the presence in IEEE 1149.1 of the TAP controller.

There exist many alternative uses of IEEE 1149.1 beyond board-level interconnect testing for purposes like silicon and software debug, emulation, in-circuit programming etc. These applications have a large hardware and software infrastructure, which relies on the presence of the IEEE 1149.1 structures. A potential benefit of basing 3D die-level wrappers on IEEE 1149.1, as in accordance with embodiments of the present invention, is that this infrastructure remains operational, also for 3D-SICs.

Figure 14:
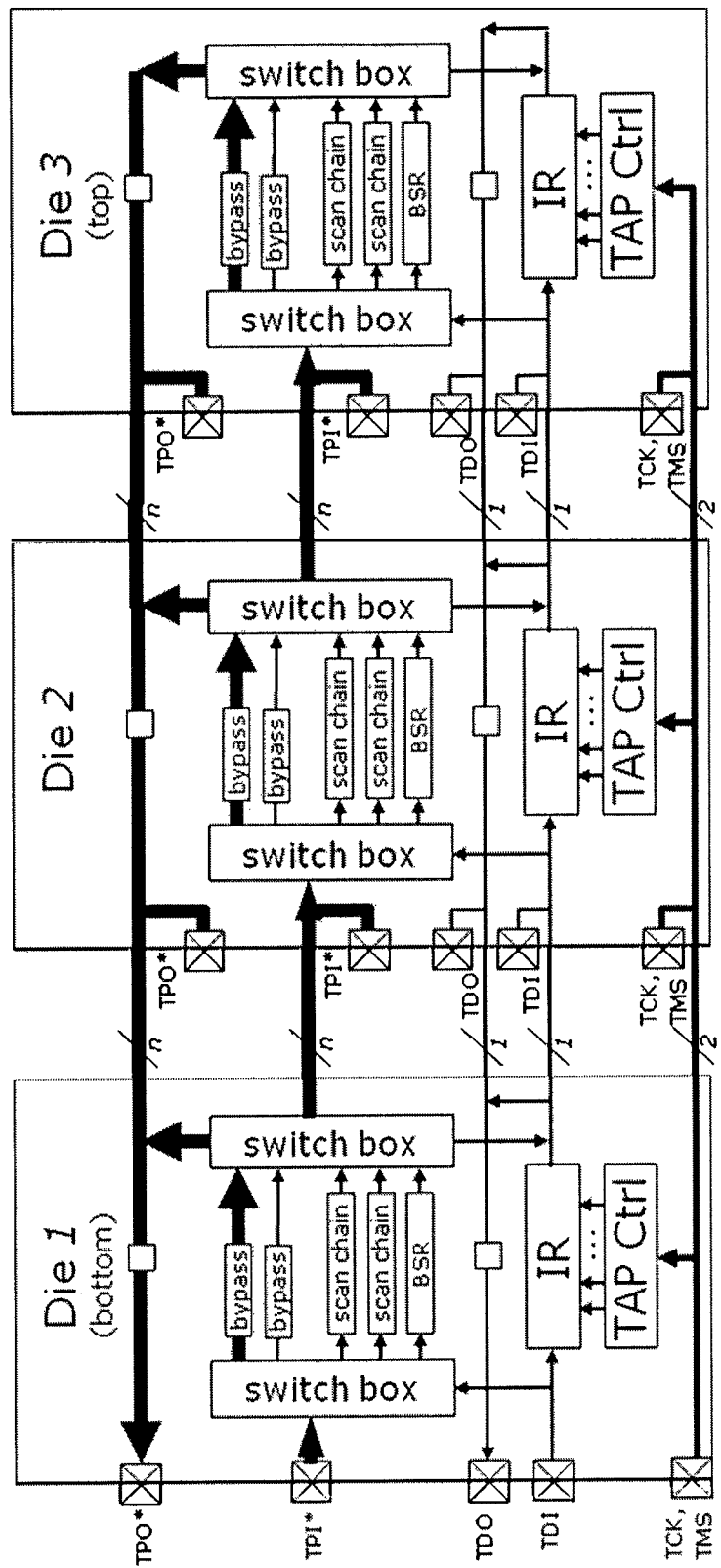
FIG. 14 illustrates a 3D-SIC DfT architecture for dies based on IEEE 1149.1, according to embodiments of the present invention.

Besides a functional mode, a test architecture according to embodiments of the present invention supports a number of test modes. FIG. 14 shows which combinations of wrapper settings can be made by traversing this so-called 'railroad diagram' from left to right. In total 16 test modes are possible: four in the pre-bond case, and twelve in the post-bond case. The following settings can be defined:

Serial/Parallel—non-test vs. test modes, resp. via serial or parallel test interface Prebond/Postbond—usage of dedicated test pads or TestElevators Bypass/Intest/Extest—selected test data register: bypass, all chains, or only the WBR chain Turn/Elevator—test responses from this die are fed via the Test-Turn directly towards the bottom die or, via TestElevators, test responses from this die are transported up and responses from a higher-level die are transported down.

This leads to the following operating modes: Functional; SerialPrebondBypassTurn, SerialPrebondIntestTurn, SerialPostbondBypassTurn, SerialPostbondIntestTurn, SerialPostbond-ExtestTurn, SerialPostbondBypassElevator, SerialPostbondIntestElevator, SerialPostbondExtest-Elevator; ParallelPrebondBypassTurn, ParallelPrebond-IntestTurn, Parallel-PostbondBypassTurn, ParallelPostbondIntestTurn, ParallelPostbondExtestTurn, ParallelPostbondBypassElevator, Parallel-Postbond IntestElevator, ParallelPostbond ExtestElevator. A bottom die does not implement the pre-bond operating modes, as a bottom die does not have dedicated test pads.

Figure 15:
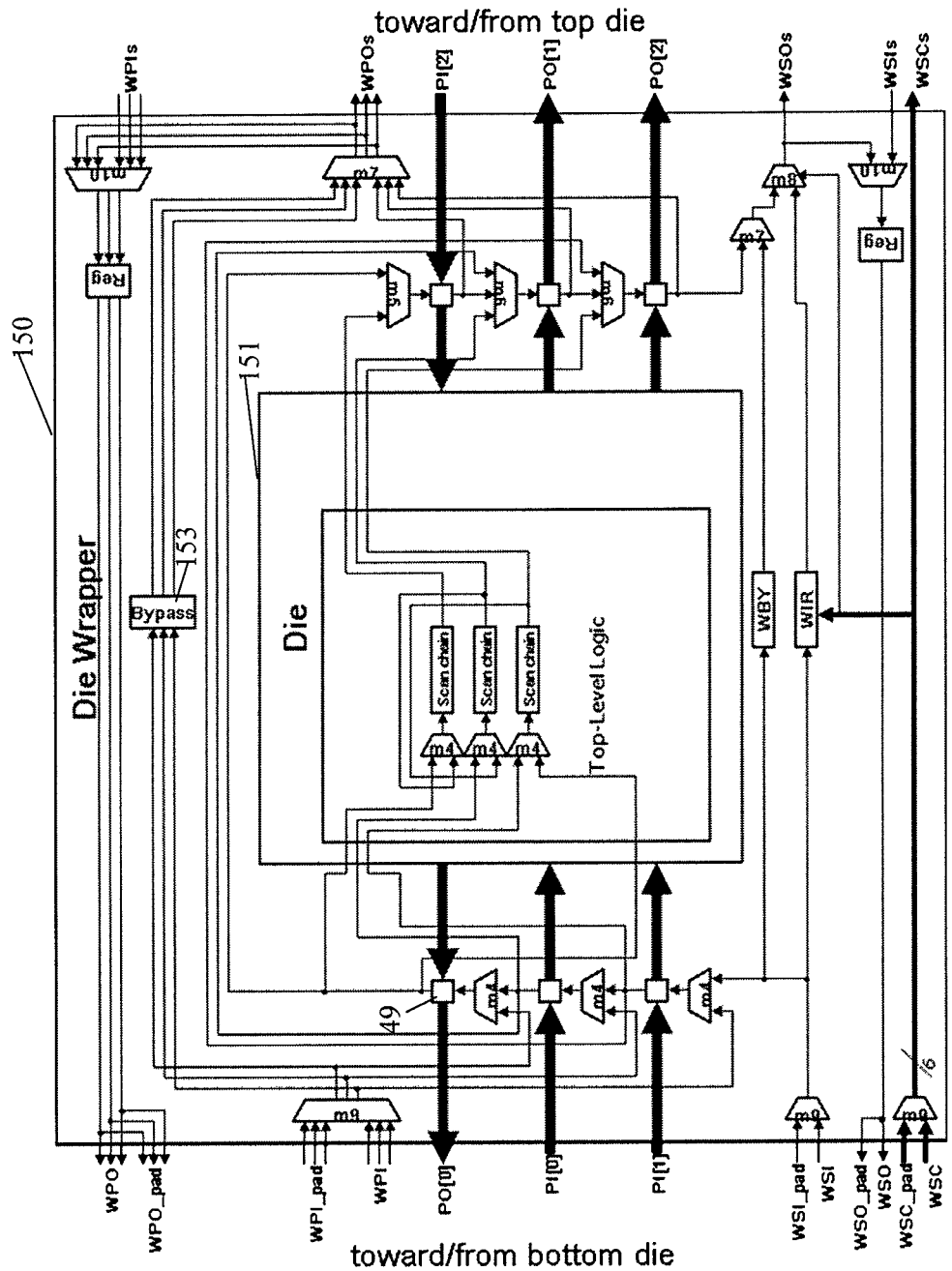
FIG. 15 illustrates an implementation of a 3D IEEE 1500-based wrapper for a flat die, in accordance with an embodiment of the present invention.

Combining instructions for the various dies in a stack allows to test one, multiple, or all dies simultaneously, as well as to test one, multiple, or all layers of TSV-based interconnects simultaneously. For example, in a four-die stack, it would be possible to simultaneously test the TSV-based interconnects between Dies 2 and 3 and the internal circuitry of Die 4, all through the high-bandwidth parallel port, by assigning the various dies in the stack the following instructions:

Die 1: ParallelPostbondBypassElevator
Die 2: ParallelPostbondExtestElevator
Die 3: ParallelPostbondExtestElevator
Die 4: ParallelPostbondIntestTurn FIG. 15 shows an implementation of a 3D-enhanced wrapper for a flat die, based on the IEEE 1500. Implementation aspects discussed are quite similar for 1149.1-based or other types of wrappers. The (simplified) example die illustrated only comprises flat top-level logic. It has three functional primary inputs (PI[0 . . . 2]) and three functional primary outputs (PO[0 . . . 2]). Some of these functional signals are adapted for being connected to the die in the stack below this one (at the left hand side of FIG. 15), and others are adapted for being connected to the die in the stack above this one (at the right hand side of FIG. 15). In FIG. 15, these functional I/Os are highlighted by bold arrows. The DfT implementation in the die comprises three internal scan chains.

The 3D enhanced die wrapper 150 according to embodiments of the present invention encapsulates the die 151. The wrapper 150 comprises all elements introduced hereinabove: WBR cells 152, WIR, serial port WSI-WSO, serial bypass WBY, parallel port WPI-WPO, parallel bypass 153, extra probe pads 49, TestElevators, pipeline registers REG. In the example illustrated, the parallel TestElevator and the parallel probe pad port are selected to be of equal width, n=m=3.

The wrapper can be reconfigured in various operating modes. Each operating mode enables a different test access path through the wrapper 150. Two examples of such operating modes and their corresponding test access path are illustrated in FIG. 16 and FIG. 17.

Figure 16:
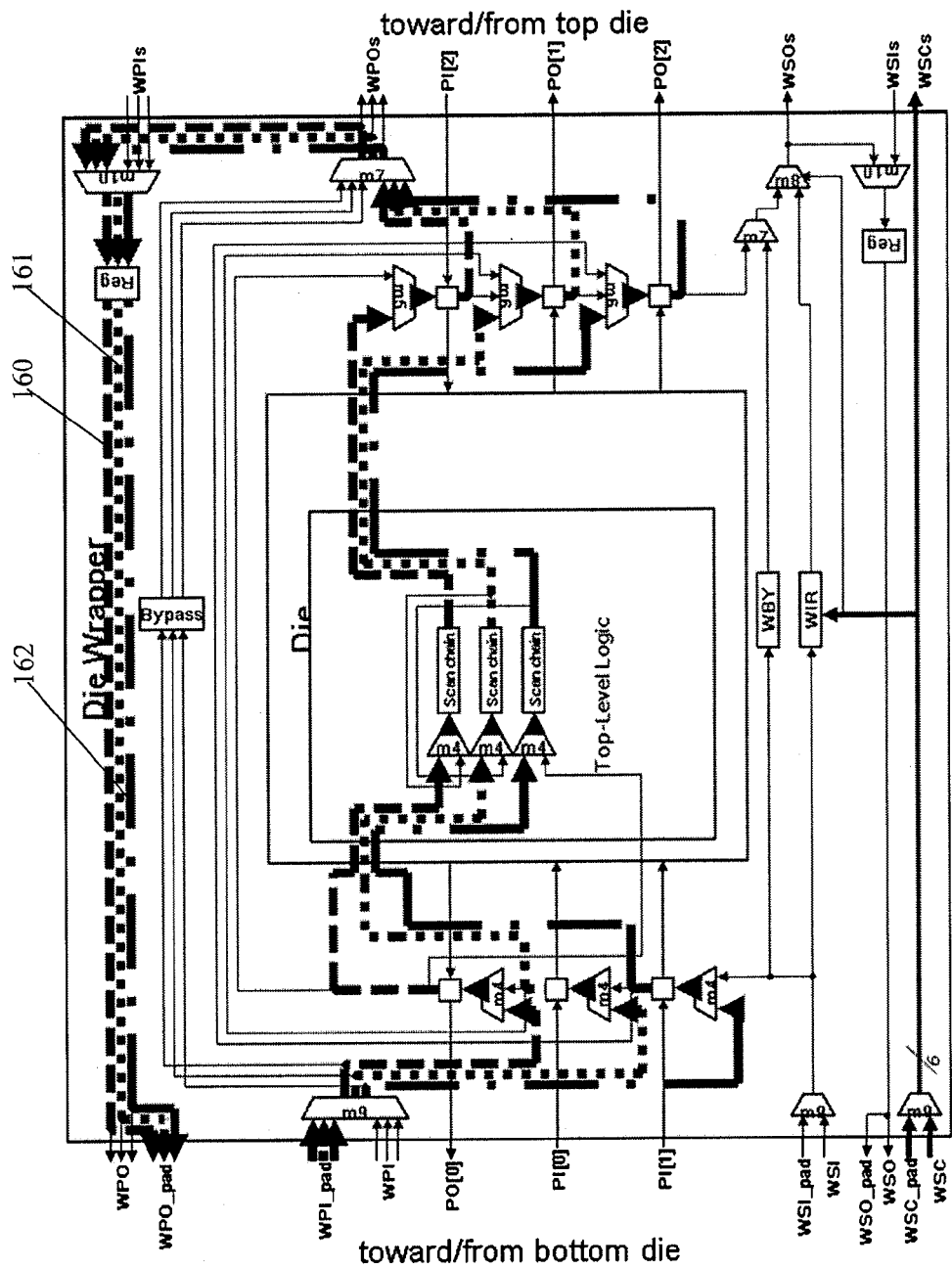
FIG. 16 illustrates test access paths corresponding to the ParallelPrebondIntestTurn mode implemented in the wrapper illustrated in FIG. 15.

FIG. 16 shows the ParallelPrebondIntestTurn mode. This mode is intended for a time-efficient high-volume production test of the intra-die circuitry before stacking. The three-bit wide access path is highlighted in the figure by means of lines 160, 161, 162.

Figure 17:
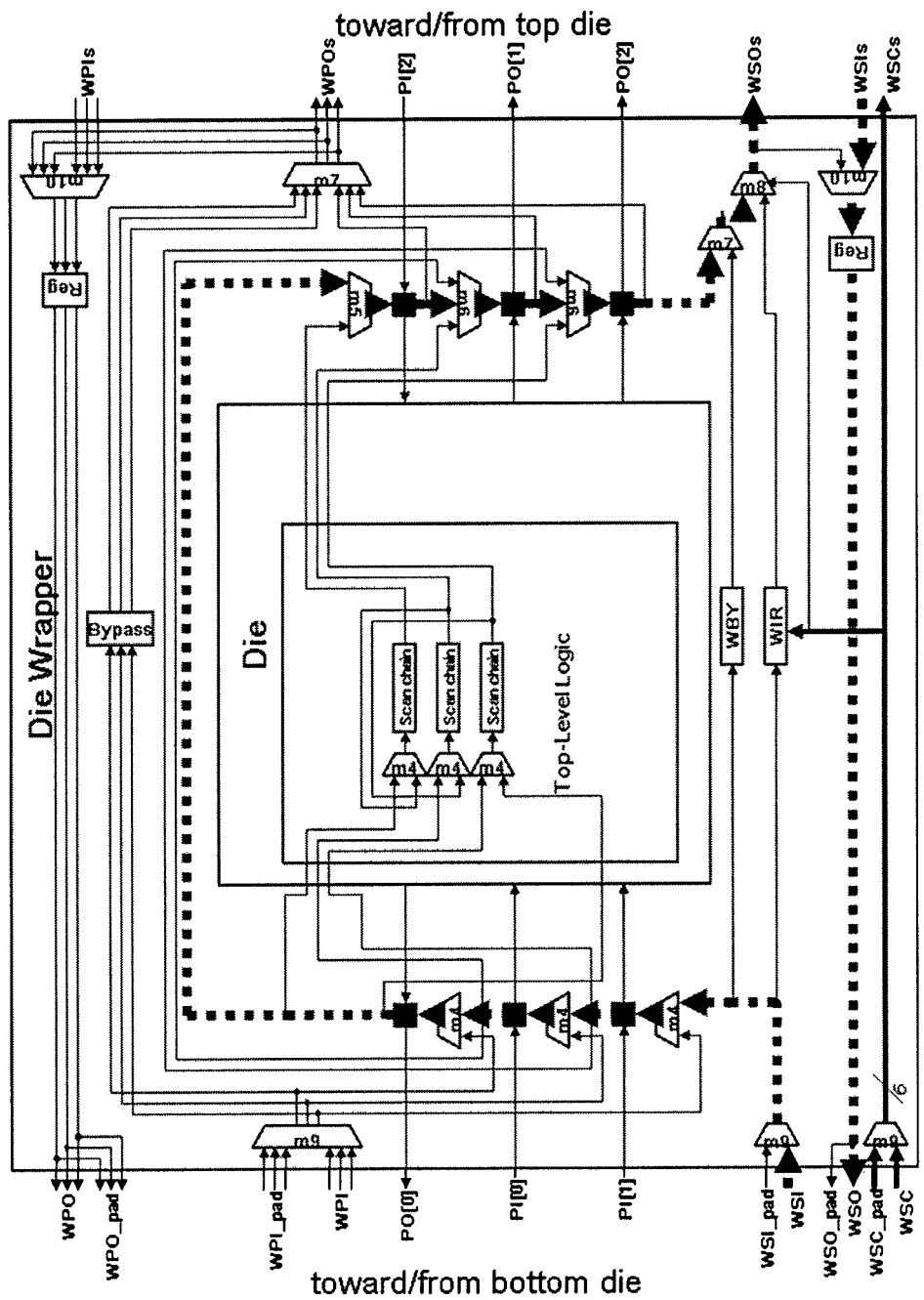
FIG. 17 illustrates test access paths corresponding to the SerialPostbondExtestElevator mode implemented in the wrapper illustrated in FIG. 15.

FIG. 17 shows the SerialPostbondExtestElevator mode. This mode is intended for a low-bandwidth test of the inter-die TSV-based connections after bonding. The single-bit access path is highlighted in the figure by means of dotted line 170.

Reconfiguration of the wrapper into its various operating modes is done through multiplexers, which are controlled by the WSC control signals an the currently active WIR instruction. In the embodiment illustrated, the wrapper multiplexers are numbered: m1, m2, . . . Multiplexers with the same name are controlled by a same control signal.

Multiplexers m4, . . . , m7 select among the conventional IEEE 1500 modes, including serial/parallel and Intest/Extest/Bypass. Multiplexer m8 is controlled by the select WIR signal from WSC and determines whether the serial port WSI-WSO is used for loading a new instruction into the WIR or for loading test data into WBR or WBY.

Multiplexer m9 selects as I/Os between the extra probe pads on the die (pre-bond testing) and the TestElevator TSVs from the die below (post-bond testing).

Multiplexer m10 selects between the Turn and Elevator operating modes.

Table I shows the assignment of all multiplexer control signals for the various operating modes of the wrapper. This table is essentially the output specification of the WIR. The input specification of the WIR is given by the user-defined instruction codes for each of the operating modes.

TABLE I

|  | Mode | | | | | | | | | |
| --- | --- | --- | --- | --- | --- | --- | --- | --- | --- | --- |
|  | m1 | m2 | m3 | m4 | m5 | m6 | m7 | m8 | m9 | m10 |
| SerialPrebondBypassTurn | x | 0 | 0 | x | x | x | 1 | 0 | 0 | 1 |
| SerialPrebondIntestTurn | 1/0 | 1 | 0 | 1 | 1 | 01 | 0 | 0 | 0 | 1 |
| ParallelPrebondBypassTurn | x | 0 | 0 | x | x | x | 0 | 0 | 0 | 1 |
| ParallelPrebondIntestTurn | 1/0 | 1 | 0 | 0 | 1 | 10 | 1 | 0 | 0 | 1 |
| SerialPostbondBypassTurn | x | 0 | 0 | x | x | x | 1 | 0 | 1 | 1 |
| SerialPostbondIntestTurn | 1/0 | 1 | 0 | 1 | 1 | 01 | 0 | 0 | 1 | 1 |
| SerialPostbondExtestTurn | 1/0 | 0 | 1 | 1 | 0 | 01 | 0 | 0 | 1 | 1 |
| SerialPostbondBypassElevator | x | 0 | 0 | x | x | x | 1 | 0 | 1 | 0 |
| SerialPostbondIntestElevator | 1/0 | 1 | 0 | 1 | 1 | 01 | 0 | 0 | 1 | 0 |
| SerialPostbondExtestElevator | 1/0 | 0 | 1 | 1 | 0 | 01 | 0 | 0 | 1 | 0 |
| ParallelPostbondBypassTurn | x | 0 | 0 | x | x | x | 0 | 0 | 1 | 1 |

TABLE I-continued

|  | Mode | | | | | | | | | |
| --- | --- | --- | --- | --- | --- | --- | --- | --- | --- | --- |
|  | m1 | m2 | m3 | m4 | m5 | m6 | m7 | m8 | m9 | m10 |
| ParallelPostbondIntestTurn | 1/0 | 1 | 0 | 0 | 1 | 10 | 1 | 0 | 1 | 1 |
| ParallelPostbondExtestTurn | 1/0 | 0 | 1 | 0 | 0 | 00 | 1 | 0 | 1 | 1 |
| ParallelPostbondBypassElevator | x | 0 | 0 | x | x | x | 0 | 0 | 1 | 0 |
| ParallelPostbondIntestElevator | 1/0 | 1 | 0 | 0 | 1 | 10 | 1 | 0 | 1 | 0 |
| ParallelPostbondExtestElevator | 1/0 | 0 | 1 | 0 | 0 | 00 | 1 | 0 | 1 | 0 |

Figure 18:
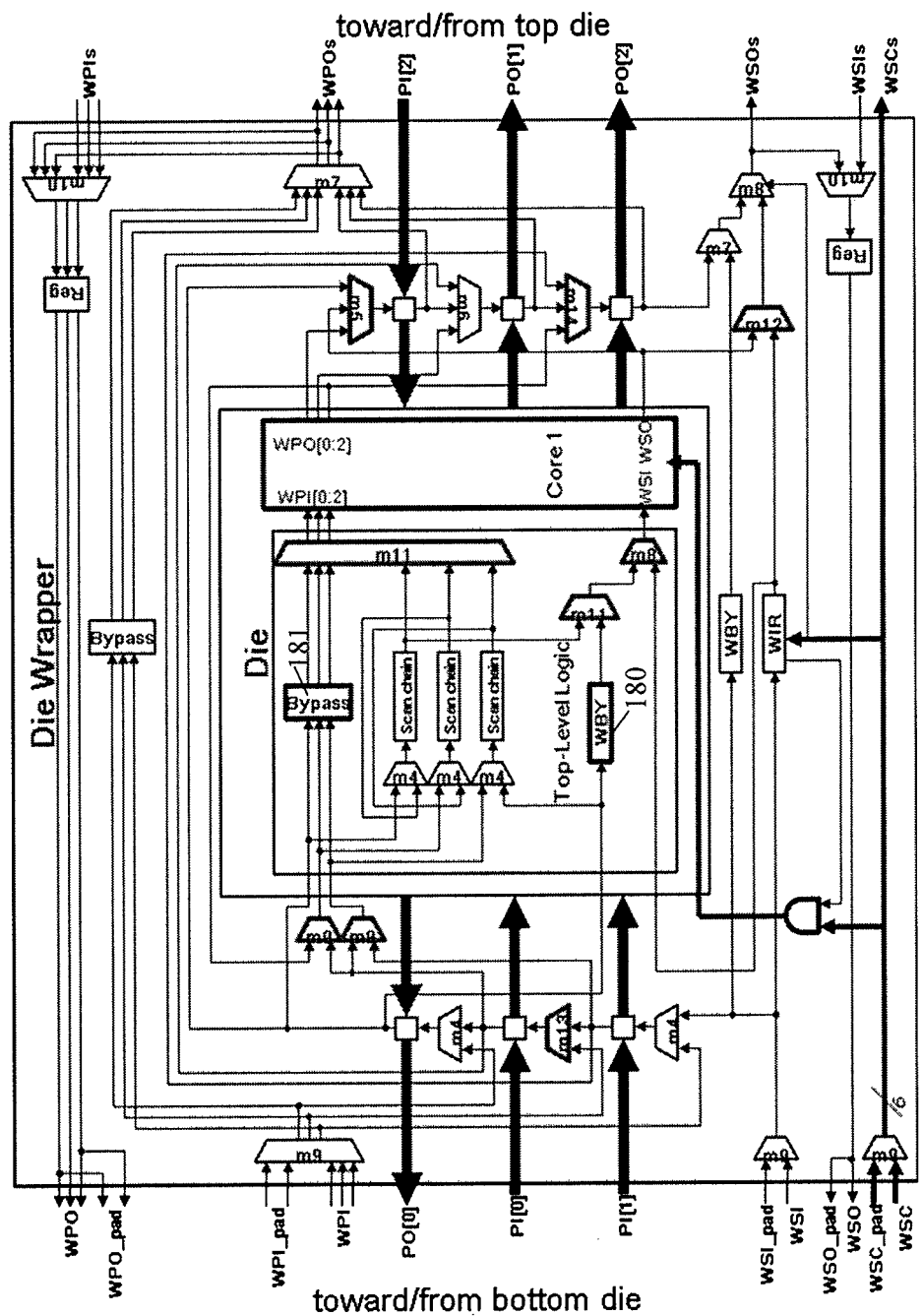
FIG. 18 illustrates an implementation of a 3D IEEE 1500-based wrapper for a hierarchical die, in accordance with an embodiment of the present invention.

A further embodiment illustrates implementation details for a slightly more complex case, in which (1) the wrapper has different widths for parallel probe pad ports and parallel TestElevator ports (i.e. n≠m; in the example illustrated n=3 and m=2), and (2) the die is a core-based SOC with top-level logic and embedded cores. FIG. 18 shows the implementation of a 3D-enhanced wrapper according to embodiments of the present invention for this case. The figure is in the same style as FIG. 15. The differences required to support (1) reside in two supplementary multiplexers m9, multiplexers m13 and m14 to switch between pre-bond parallel test modes (with m=2) and post-bond parallel test modes (with m=3).

In this example, the die has one embedded core: Core 1. In the simplified example, the single core Core 1 may actually represent a possibly larger number of embedded cores. Core 1 is wrapped with a conventional IEE 1500 wrapper (not shown) with a parallel port WPI-WPO of three bits wide.

The internal scan chains in the die's top-level logic, which embeds Core 1, is equipped with local serial and parallel bypasses 180, 181. These bypasses become active in case it is desired to test Core 1 on its own, i.e. without testing the die's top-level logic. In FIG. 18 these bypasses are shown with multiplexers m11. They are controlled from a WIR bit. Instead of adding a single-bit WIR in the die's top-level logic, the die-level WIR can be extended with this one extra bit.

Figure 19:
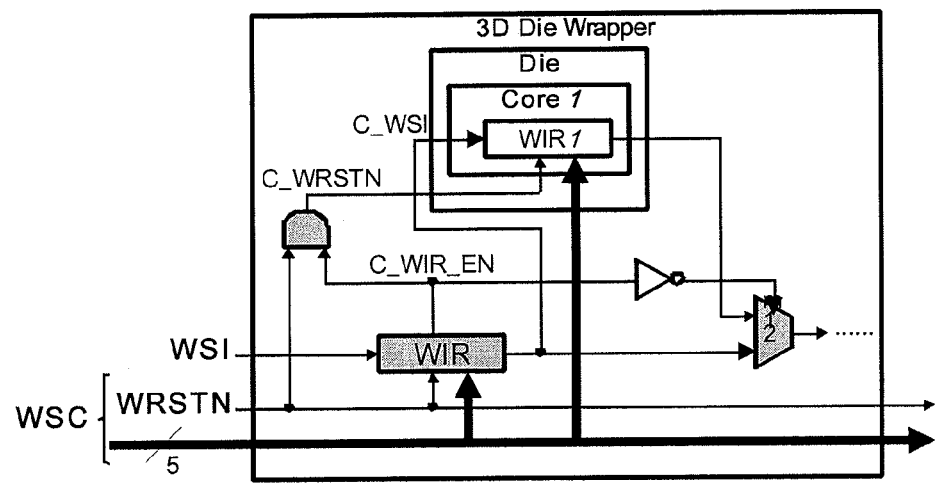
FIG. 19 illustrates an implementation of the hierarchical WIR control mechanism according to embodiments of the present invention.

As this example contains an embedded core, it may implement the hierarchical WIR feature according to embodiments of the present invention. FIG. 19 details an implementation of this feature. All die-level WSC signals are passed on to WIR1 of Core1, apart from the signal WRSTN, which is AND-gated with C_WIR_EN. This ensures that WIR1 of Core 1 is kept in its (functional) reset state, until it is enabled. As a response to appropriate instructions, the die-level WIR asserts a pseudo-static test control signal C_WIR_EN that indicates when the core-level WIRs should be enabled. When WIR1 is enabled, multiplexer m12 extends the WIR chain to include WIR1 in it.

Figure 20:
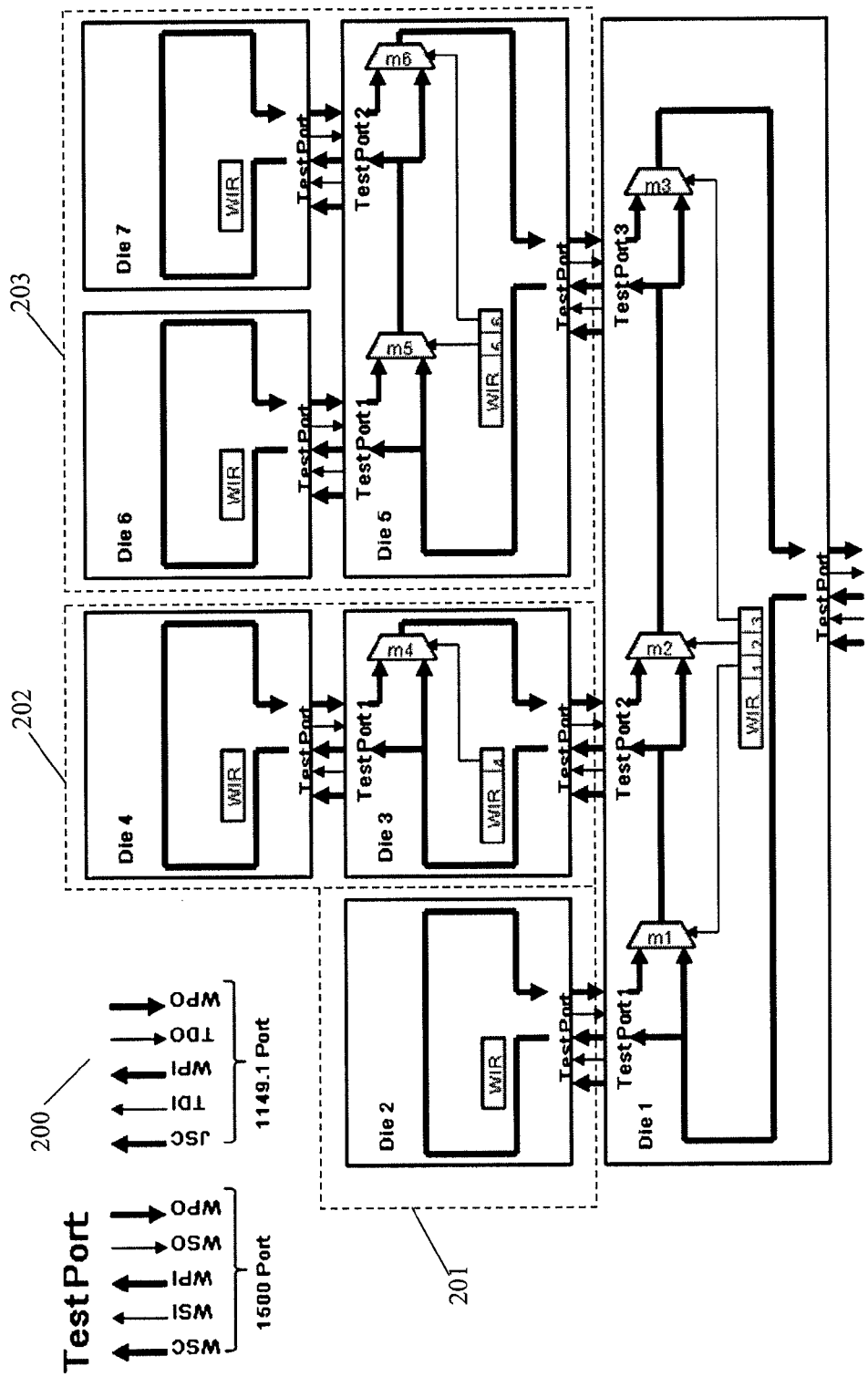
FIG. 20 illustrates a stack according to an embodiment of the present invention, the stack comprising a plurality of die-towers.

In the above description, the stacks disclosed comprise at least one die according to embodiments of the present invention, such that single-tower stacks are obtained. In alternative embodiments, however, the present invention can also be implemented in multi-tower stacks. An example is illustrated in FIG. 20. In the example illustrated, the stack 200 comprises a bottom die Die 1, with on top thereon a first tower 201, a second tower 202 and a third tower 203. The first tower 201 consists of a single die Die 2. The second tower 202 consists of a stack of two dies, Die 3 and Die 4, stacked onto one another. The third tower 203 consists of a stack of a plurality of dies: Die 5 with stacked thereon, one next to the other, Die 6 and Die 7.

It is assumed that each die, except the bottom die Die 1, has a die underneath it, and has k dies or towers of dies stacked onto it, with k=0 for a top die such as Die 2, Die 4, Die 6, Die 7 and 0<k for middle dies such as Die 3, Die 5.

In accordance with embodiments of the present invention, a die has a test port at the bottom side, bottom side being defined as above, as that side oriented towards the external I/Os of the stack. Furthermore, each die has k identical test ports at its top side, the top side being the side remote from the bottom side. A single test port is responsible for transporting test control data and data signals into a single tower and back. If k>1 for a particular die, the interface at the top-side of the die is extended from 1 to k. If k>0 (meaning that the die under reference is not a top die), then k multiplexers are needed, one for each port at the top side. The multiplexers, depending on their setting, determine for each port at the top side of the die whether that port is used (in which case test signals are transmitted to a die higher up in the stack) or not (in which case a TestTurn is implemented). FIG. 20 illustrates the multiplexers in the parallel test path, but they are also present in the serial test path (not illustrated in FIG. 20; similar drawing but with single bit lines). In this embodiment, the multiplexers are driven by the WIRs, which now have k Turn/Elevate instruction bits rather than 1 such instruction bit in the single-tower case.

Figure 31:
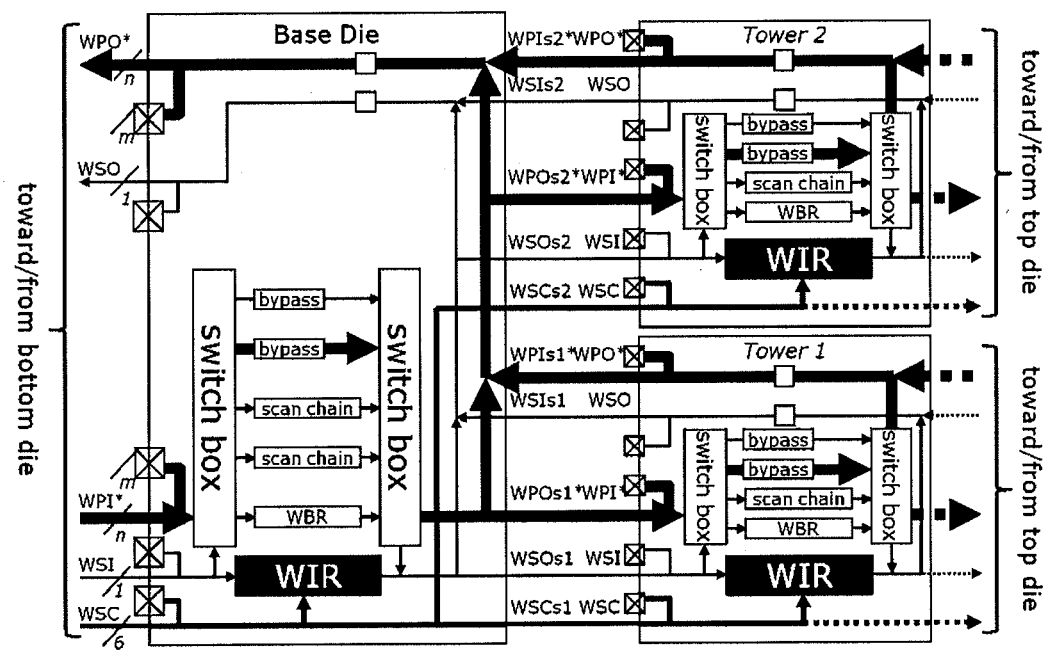
FIG. 31 illustrates a test architecture according to embodiments of the present invention for a 3D-SIC having two towers.

FIG. 31 depicts how two towers are connected on top of a base die. It is to be noted that the die level wrappers of the dies in these towers may be as in accordance with embodiments of the present invention as disclosed above. Dies in these towers do not need to be 'aware' of the fact that they are part of a multi-tower stack. All DfT architecture changes pertain to the base die, which obviously needs to be prepared for stacking multiple towers on top of it. It is to be noted that FIG. 31 illustrates two towers stacked on top of the base die, but this example can be extended to any arbitrary number of towers; it simply requires more test ports, multiplexers and corresponding WIR control bits. The towers can consist of any suitable number of dies.

The example multi-tower 3D-SIC in FIG. 20 has three towers 201, 202, 203 on base die 1. This means that Die 1 needs to be equipped with three test ports on its top side. Die 3 has only one die stacked on top of itself, and hence requires only one test port at its top side. Die 5 has two sub-towers and hence needs to be equipped with two test ports on its top side. The other dies in the 3D SIC are top dies (i.e. have no other dies on top of them) and hence do not require any test ports at their top side.

The example 3D-SIC of FIG. 20 has six multiplexers m1, . . . , m6 that implement the various Turn/Elevate configuration controls. The controls for these six multiplexers are shown as explicit bits in the WIRs of the corresponding dies.

For the WIR chain, three variants can be implemented: (1) all die-level WIRs are concatenated—see FIG. 21; (2) at each split of WIRs towards a higher die-level, the WIRs may be included in a harmonica manner as described above—see FIG. 22; or (3) at each step towards a higher die-level the WIRs are explicitly opened up—see FIG. 23.

Figure 21:
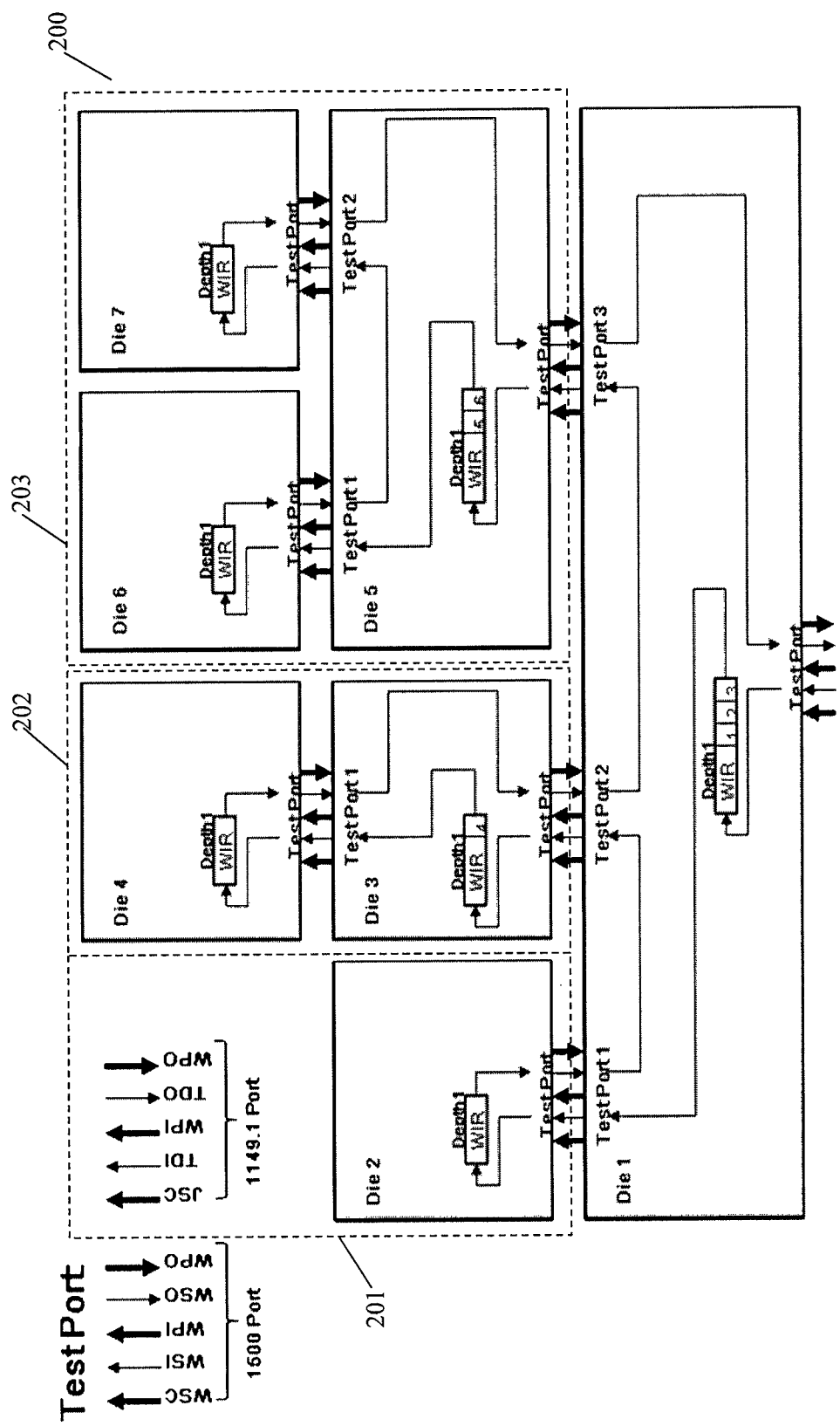
FIG. 21 illustrates WIR connection in the die stack of FIG. 20 according to one embodiment of the present invention.

The daisychain architecture as illustrated in FIG. 21 allows for very flexible test access path configuration. Any die or combination of dies can be included or excluded from the daisychain test access path by giving the appropriate setting for the new additional WIR control bits. FIG. 21 shows an example of a serial TAM daisychain which includes all dies. For the dies included in the current test access path, further WIR settings determine whether they are in Intest, Extest or Bypass test modes. This gives almost full freedom with respect to test scheduling. The only limitation is the Intest and Extest modes are mutually exclusive per die.

Figure 22:
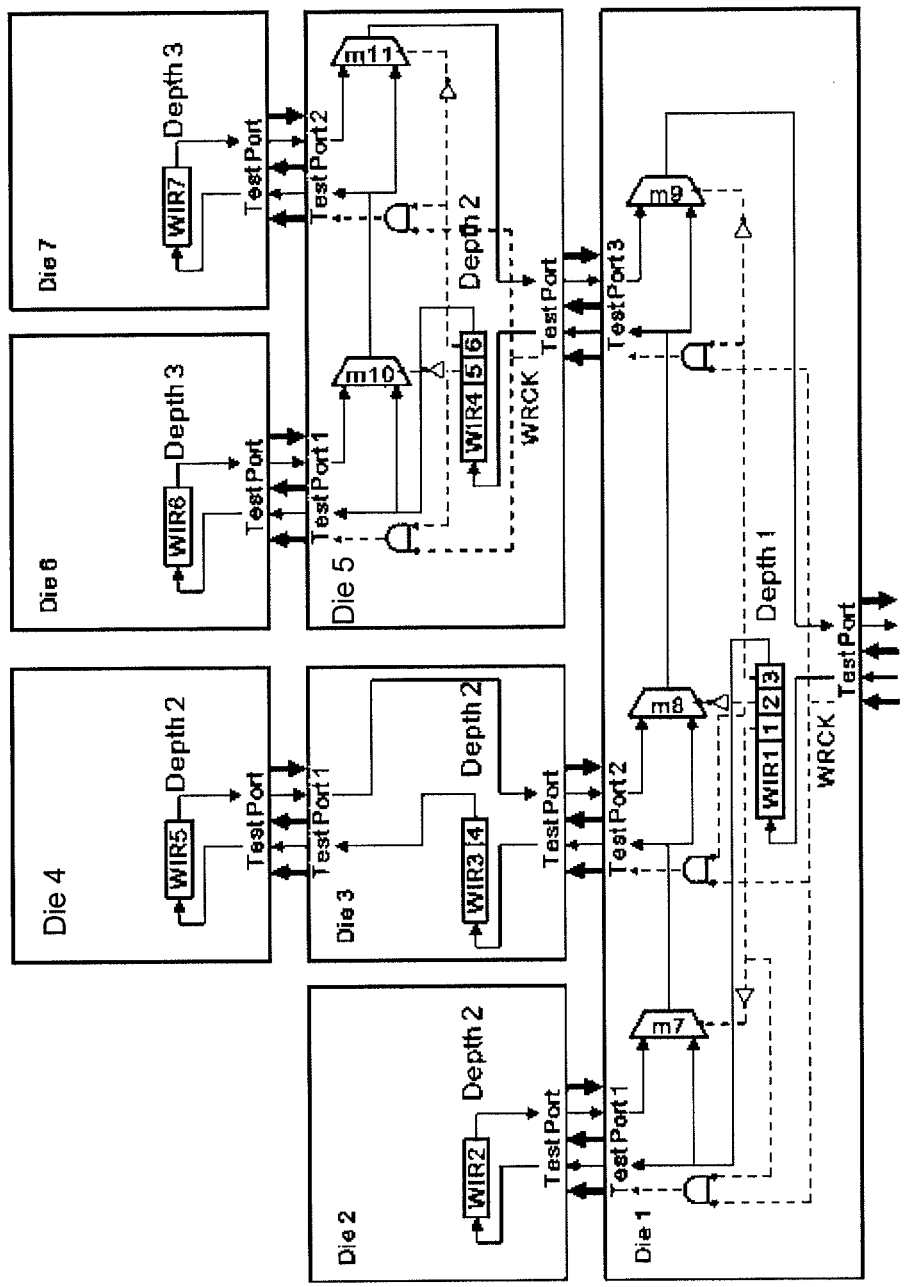
FIG. 22 illustrates WIR connection in the die stack of FIG. 21 according to another embodiment of the present invention.

FIG. 22 shows a Tower-by-Tower scheme implemented on the example 3D-SIC of FIG. 20. In FIG. 20, control bits were added to the various WIRs to control the new test path configuration multiplexers m1, . . . , m6. In order to implement the Tower-by-Tower scheme, five additional multiplexers m7, . . . , m11 are used to select which WIRs are included in the WIR chain. The control signals for the multiplexers m7, . . . , m11 are the same as those for m1, . . . , m6, since a die should get either both instructions and test data or neither of them. In FIG. 22, solid lines depict the concatenation of die-level WIRs, while dotted lines represent control signals for the WIR chain configuration. In the Tower-by-Tower scheme, loading WIR instructions typically becomes a multi-step operation. After power-on-reset, the 3D-SIC is in its functional mode, and initially only the WIR of the bottom die is included in the WIR chain. By loading an instruction into this WIR and appropriately defining control bits 1, 2, and 3, the WIRs of one or more towers can be included in the WIR chain. Inclusion of the WIRs of the sub-towers consisting of Dies 6 and 7 requires again one more WIR load in order to program control bits 5 and 6. In general, it can be stated that each WIR has a depth associated with it, and that loading instructions into a WIR at depth d requires that the WIR at depth d−1 is configured appropriately first (for d≥2). When excluded from the overall WIR chain, die-level WIRs are kept in their (safe) functional reset state and the global WRCK clock to them is gated to save power consumption, by means of a logic AND with the corresponding Turn/Elevate WIR control bit.

Figure 23:
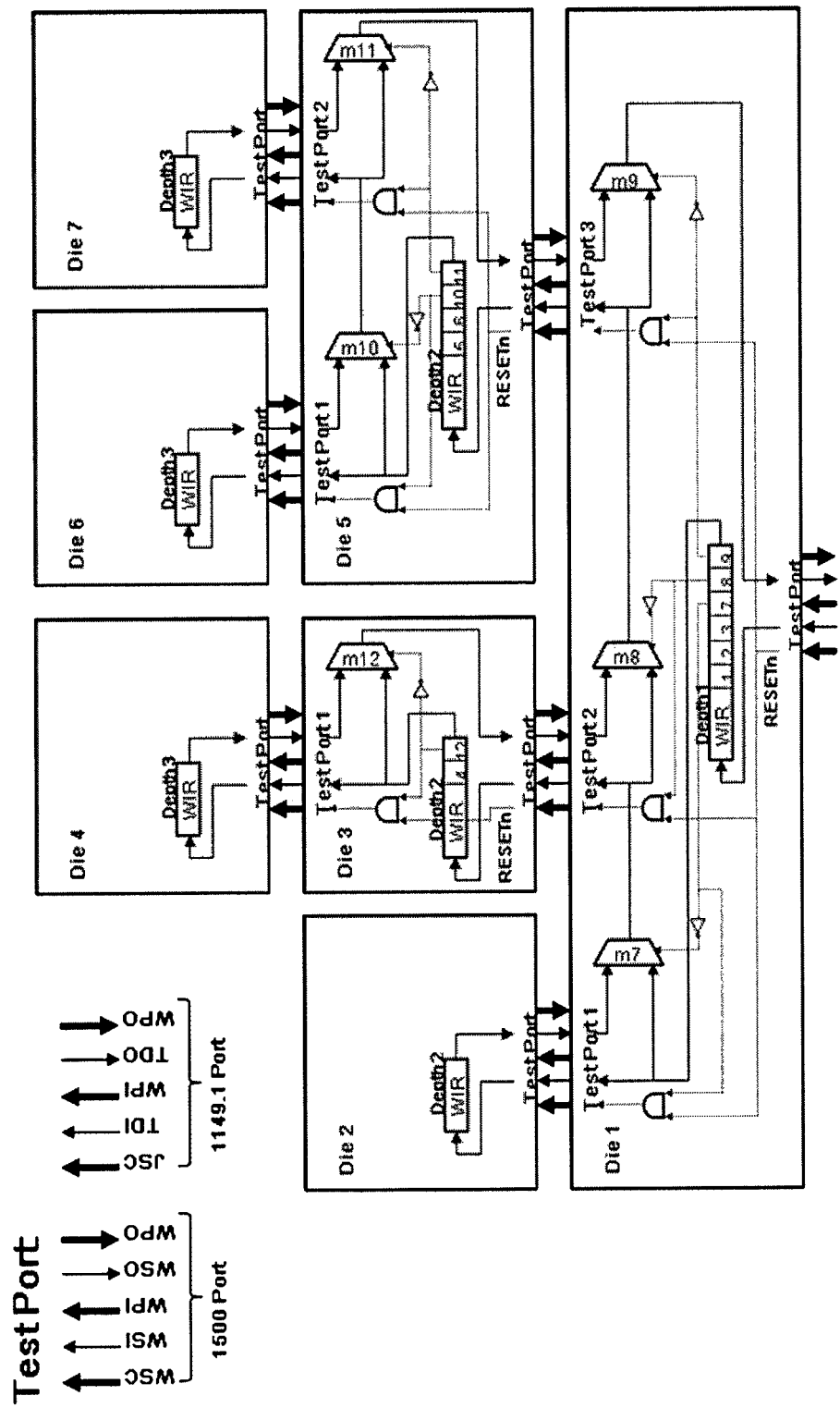
FIG. 23 illustrates WIR connection in the die stack of FIG. 21 according to yet another embodiment of the present invention.

The Level-by-Level WIR scheme as in FIG. 23 can be derived from FIG. 22 by adding an additional multiplexer m12 and associated INV and AND gates to Die 3, such that WIR4 is put at depth 3. In this scheme, die-level WIRs can only be programmed if they have been included in the overall WIR chain by the WIR of the die below them.

The three WIR configuration schemes above differ in (1) the number of distinct WIRs that are included in the overall WIR chain, (2) the time required to configure the WIR chain, and (3) associated area cost. Scheme 1 has no WIR configuration time, but always requires all WIRs to be loaded with instructions; even the ones which are actually irrelevant at some moment of the test. Consequently, Scheme 1 has the lowest area costs, as it does not require extra multiplexers and clock-gating. Scheme 3 requires the most elaborate WIR configuration procedures, but allows the WIR chain to be configured such that it only contains the WIRs which are relevant at that moment. Scheme 2 is in between these two extremes. Depending on the design parameters of a specific 3D-SIC, such as the number of towers, the height of each tower, and the length of each die-level WIR, users can choose a most suitable scheme to meet requirements.

In case of a hierarchical WIR instruction register, both in case of tower stacks or conventional die stacks, where core-level instruction registers can be optionally bypassed, alternative embodiments may be provided in accordance with embodiments of the present invention.

Figure 32:
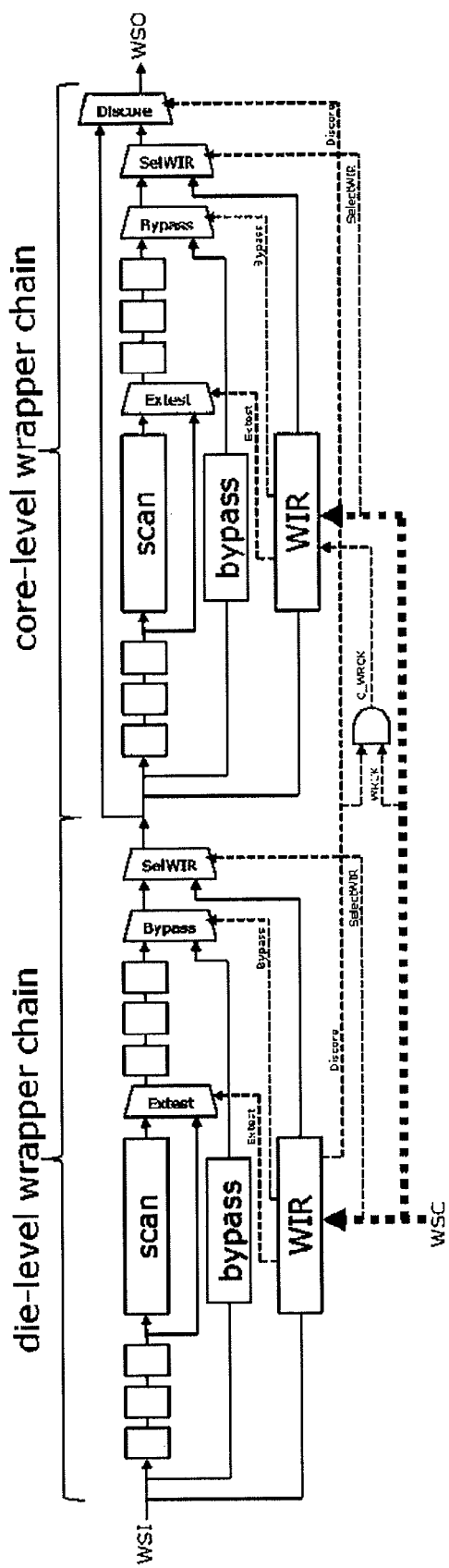
FIG. 32 illustrates a wrapper chain configuration between WSI and WSO for a hierarchical SOC die containing an embedded core.

As a first embodiment, instead of only bypassing the instruction register, the entire embedded core in question (including both instruction register and test data path) may be bypassed altogether. An implementation of this embodiment is illustrated in FIG. 32. This leads to an extra bit in the Instruction Register, for enabling or disabling the core.

As a second embodiment, the notion of bypassable instruction registers may be extended from embedded cores only to instruction registers in the higher-level dies and towers. In this second embodiment, also the instruction registers and/or test data paths of higher-level dies and/or towers may be bypassed. When for example considering FIG. 31, if it is desired to only test the Base Die, there is no strict need to set the instruction registers of the dies in Tower 1 nor Tower 2. In an embodiment similar to bypassing embedded cores (viz., with a Encore/Discore control signal), higher-level dies and/or towers can now be Enabled/Disabled.

Figure 33:
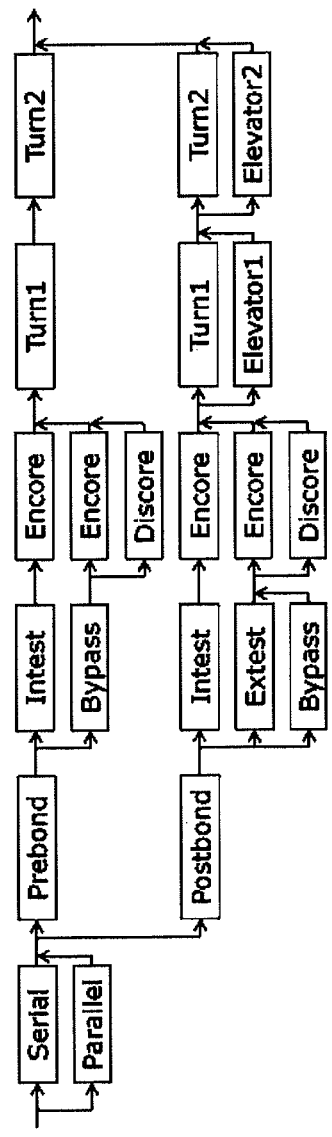
FIG. 33 is a 'railroad diagram' for operating mode set-up for a hierarchical SOC with embedded cores and k=2 towers.

FIG. 33 shows for the example of a hierarchical SOC containing embedded cores and which has two next-higher towers (k=2), which combinations of wrapper settings can be made, by traversing the illustrated so-called 'railroad diagram' from left to right. It is to be noted that almost all combinations of the options above can be made. Exceptions are that Extest and Elevator options do not make sense in the Prebond case (as there are no stack neighbours yet), and that Discore cannot be combined with Intest (as Intest always requires the wrappers of the embedded cores to be enabled). In the example of FIG. 33, in total 46 test modes are possible: six in the pre-bond case, and 40 in the post-bond case. Some examples of operating modes are SerialPrebondIntestTurn1Turn2, ParallelPrebondIntestTurn1Elevator2, SerialPostbondBypassElevator1Turn2, and ParallelPostbond-ExtestElevator1Elevator2. For a generic flat design with k towers, there are $4+6 \cdot 2^k$ test modes; this number grows to $6+10 \cdot 2^k$ for a hierarchical SOC with embedded cores.

Combining instructions for the various dies in a stack allows to test one, multiple, or all dies simultaneously, as well as test one, multiple, or all layers of TSV-based interconnects simultaneously. Hence, the test architecture according to embodiments of the present invention allows flexible scheduling during test execution. This can for example be exploited in an Abort-on-Fail set-up to (re-)schedule short and/or likely-to-fail tests first and thus reduce the average test time.

Figure 34:
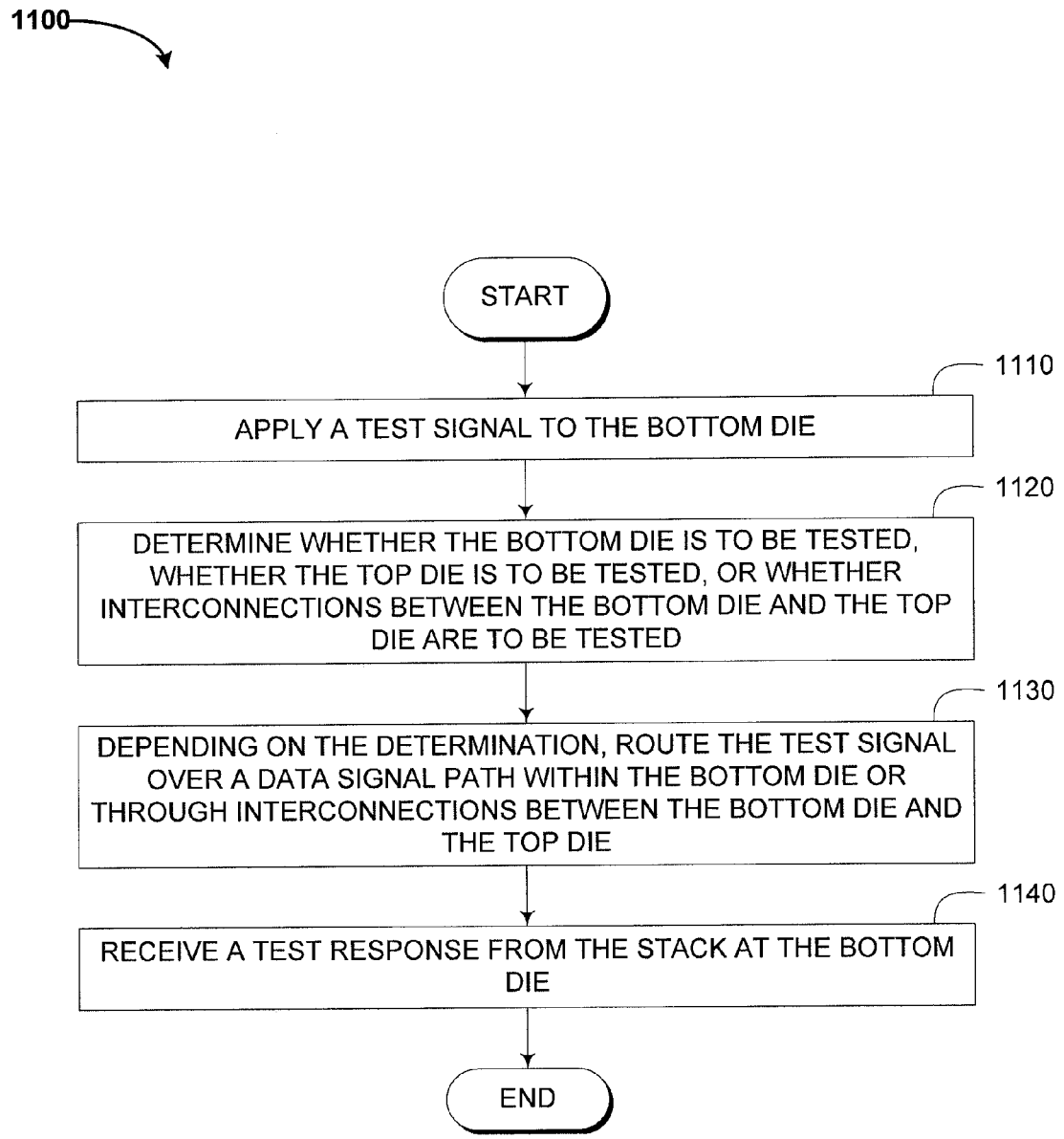
FIG. 34 shows a flowchart of one embodiment of a method of testing a stack of dies comprising a bottom die and a top die stacked on top of the bottom die.

FIG. 34 shows a flowchart of one embodiment of a method of testing a stack of dies comprising a bottom die and a top die stacked on top of the bottom die. The method 1100 may include, at block 1110, applying a test signal to the bottom die. Moving to block 1120, the method may further include determining whether the bottom die is to be tested, whether the top die is to be tested, or whether interconnections between the bottom die and the top die are to be tested. Next at block 1130, the method may further include depending on the determination, routing the test signal over a data signal path within the bottom die or through interconnections between the bottom die and the top die. Moving to block 1140, the method may further include receiving a test response from the stack at the bottom die.

Figure 35:
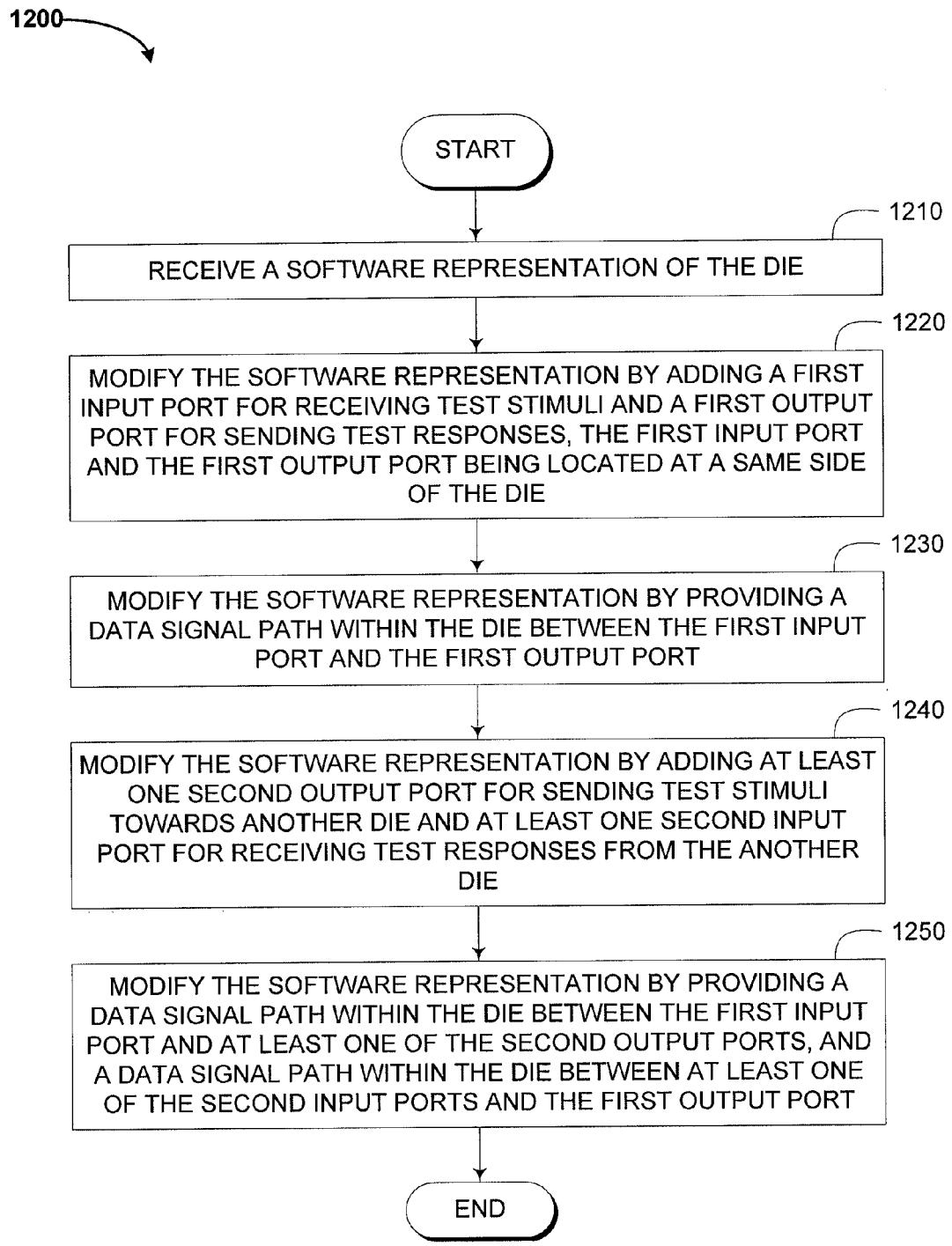
FIG. 35 shows a flowchart of one embodiment of a method of designing a testable die.

FIG. 35 shows a flowchart of one embodiment of a method of designing a testable die. The method 1200 may include, at block 1210, receiving a software representation of the die. Moving to block 1220, the method may further include modifying the software representation of the die by adding a first input port for receiving test stimuli and a first output port for sending test responses, the first input port and the first output port being located at a same side of the die. Next at block 1230, the method may further include modifying the software representation of the die by providing a data signal path within the die between the first input port and the first output port. Moving to block 1240, the method may further include modifying the software representation of the die by adding at least one second output port for sending test stimuli towards another die and at least one second input port for receiving test responses from the another die. Next at block 1250, the method may further include modifying the software representation of the die by providing a data signal path within the die between the first input port and at least one of the second output ports, and a data signal path within the die between at least one of the second input ports and the first output port.

Although systems and methods as disclosed, are embodied in the form of various discrete functional blocks, the systems could equally well be embodied in an arrangement in which the functions of any one or more of those blocks or indeed, all of the functions thereof, are realized, for example, by one or more appropriately programmed processors or devices.

It is to be noted that the processor or processors may be a general purpose, or a special purpose processor, and may be for inclusion in a device, e.g., a chip that has other components that perform other functions. Thus, one or more aspects of the present invention can be implemented in digital electronic circuitry, or in computer hardware, firmware, software, or in combinations of them. Furthermore, aspects of the invention can be implemented in a computer program product stored in a computer-readable medium for execution by a programmable processor. Method steps of aspects of the invention may be performed by a programmable processor executing instructions to perform functions of those aspects of the invention, e.g., by operating on input data and generating output data. Accordingly, the embodiment includes a computer program product which provides the functionality of any of the methods described above when executed on a computing device. Further, the embodiment includes a data carrier such as for example a CD-ROM or a diskette which stores the computer product in a machine-readable form and which executes at least one of the methods described above when executed on a computing device.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A die comprising test circuitry configured to test the die and further configured to test interconnections between the die and another die, the test circuitry comprising:
   a first input port configured to receive test stimuli;
   a first output port configured to send test responses, the first input port and the first output port being located at a first major surface on a same side of the die,
   wherein the test circuitry includes a data signal path within the die between the first input port and the first output port, such that the circuitry is configured to test the die using the test stimuli received through the first input port;
   at least one second output port configured to send test stimuli towards the other die; and
   at least one second input port configured to receive test responses from the other die,
   wherein the test circuitry includes a data signal path within the die between the first input port and at least one of the second output ports, and wherein the test circuitry includes a data signal path within the die between at least one of the second input ports and the first output port, such that the test circuitry is configured to test the other die using the test stimuli sent towards the other die.

2. The die according to claim 1, further comprising a number of switches configured to switch between a mode for sending signals over the data signal path within the die between the first input port and the first output port and a mode for sending signals within the die between at least one of the second input ports and the first output port.

3. The die according to claim 1, further comprising an instruction register configured to load and store instructions determining whether test responses will be sent towards one of the first output port from either one of the first input port or from one of the at least one second input ports.

4. The die according to claim 1, further comprising at least one registration element in the signal path between the first input port and the at least one second output port and at least one registration element in the signal path between the at least one second input port and the first output port.

5. The die according to claim 1, further comprising at least one further input port and/or at least one further output port for facilitating pre-bond die testing, the at least one further input port and/or at least one further output port being connected to the data signal path between the first input port and the first output port and/or to the data signal path between the first input port and at least one of the second output ports, and/or to the data signal path between at least one of the second input ports and the first output port.

6. The die according to claim 5, further comprising detection circuitry configured to automatically detect whether the die is in pre-bond or post-bond configuration.

7. The die according to claim 6, wherein the detection circuitry is configured to generate a control signal for selecting between the at least one first input port and the at least one further input port.

8. The die according to claim 1, comprising at least two second output ports configured to send test stimuli towards the other die and at least two second input port configured to receive test responses from the other die, wherein there is a data signal path within the die between the first input port and at least one of the second output ports, and wherein there is a data signal path within the die between at least one of the second input ports and the first output port.

9. A stack comprising at least one die according to claim 1.

10. The stack according to claim 9, wherein the stack comprising at least a first and a second die, wherein a second output port of the first die is connected to a first input port of the second die, and a first output port of the second die is connected to a second input port of the first die.

11. The stack according to claim 9, wherein at least one die comprises external input/output ports.

12. The stack according to claim 9, wherein a plurality of instruction registers associated with different dies are concatenated in a register chain.

13. The stack according to claim 12, wherein at least one die in the stack comprises at least one embedded core provided with at least one core-level instruction register, wherein the register chain is a hierarchical instruction register chain adapted for operation such that a die-level instruction register instruction determines whether core-level instruction registers are bypassed.

14. The stack according to claim 12, wherein at least one die in the stack has at least one other die stacked thereon, wherein the register chain is a hierarchical instruction register chain adapted for operation such that a die-level instruction register instruction determines whether the die-level instruction register of the at least one other die is bypassed.

15. A method of testing a stack of dies comprising a bottom die and a top die stacked on top of the bottom die, the method comprising:
    applying a test signal to the bottom die;
    determining whether the bottom die is to be tested, whether the top die is to be tested, or whether interconnections between the bottom die and the top die are to be tested;
    depending on the determination, routing the test signal over a data signal path within the bottom die or through interconnections between the bottom die and the top die; and
    receiving a test response from the stack at the bottom die.

16. A non-transitory computer readable medium having stored thereon instructions which, when executed on a processor, carries out a method of claim 15.

17. The method of claim 15, wherein the method is performed by a processor.

18. A method of designing a testable die, the method comprising:
    receiving a software representation of the die; and
    modifying the software representation of the die, the die representation modifying comprising:
        adding a first input port for receiving test stimuli and a first output port for sending test responses, the first input port and the first output port being located at a same side of the die,
        providing a data signal path within the die between the first input port and the first output port,
        adding at least one second output port for sending test stimuli towards another die and at least one second input port for receiving test responses from the another die, and
        providing a data signal path within the die between the first input port and at least one of the second output ports, and a data signal path within the die between at least one of the second input ports and the first output port.

19. A non-transitory computer readable medium having stored thereon instructions which, when executed on a processor, carries out a method of claim 18.

20. The method of claim 18, wherein the method is performed by a processor.

* * * * *